(12) United States Patent
Alcorn et al.

(10) Patent No.: US 11,842,997 B2
(45) Date of Patent: *Dec. 12, 2023

(54) METHODS FOR PILLAR CONNECTION ON FRONTSIDE AND PASSIVE DEVICE INTEGRATION ON BACKSIDE OF DIE

(71) Applicant: Wolfspeed, Inc., Durham, NC (US)

(72) Inventors: Terry Alcorn, Cary, NC (US); Daniel Namishia, Wake Forest, NC (US); Fabian Radulescu, Chapel Hill, NC (US)

(73) Assignee: Wolfspeed, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/699,680

(22) Filed: Mar. 21, 2022

(65) Prior Publication Data

US 2022/0208758 A1  Jun. 30, 2022

Related U.S. Application Data

(63) Continuation of application No. 16/889,432, filed on Jun. 1, 2020.

(51) Int. Cl.
*H01L 27/06* (2006.01)
*H01L 21/683* (2006.01)
(Continued)

(52) U.S. Cl.
CPC ...... *H01L 27/0694* (2013.01); *H01L 21/6835* (2013.01); *H01L 21/76898* (2013.01);
(Continued)

(58) Field of Classification Search
CPC .......... H01L 27/0694; H01L 21/76898; H01L 27/0605; H01L 2924/1421
See application file for complete search history.

(56) References Cited

U.S. PATENT DOCUMENTS 6,825,559 B2  11/2004  Mishra et al.
7,259,402 B2   8/2007  Edmond et al.
(Continued)

FOREIGN PATENT DOCUMENTS

CA   2511005 C   5/2016
CN   1757119 B   2/2011
(Continued)

OTHER PUBLICATIONS

Notification of Transmittal of the International Search Report and the Written Opinion of the International Searching Authority, or the Declaration, in corresponding PCT Application No. PCT/US2021/033981 (dated Dec. 21, 2021).

*Primary Examiner* — Mamadou L Diallo
(74) *Attorney, Agent, or Firm* — Myers Bigel, P.A.

(57) ABSTRACT

An integrated circuit device includes a radio frequency transistor amplifier die having a first surface, a second surface, a semiconductor layer structure that is between the first and second surfaces and includes a plurality of transistor cells adjacent the first surface, and terminals coupled to the transistor cells. At least one passive electronic component is provided on the second surface of the die and is electrically connected to at least one of the terminals, for example, by at least one conductive via. One or more conductive pillar structures may protrude from the first surface of the die to provide electrical connections to one or more of the terminals.

30 Claims, 17 Drawing Sheets

(51) Int. Cl.
*H01L 21/768* (2006.01)
*H01L 21/8258* (2006.01)
*H01L 23/48* (2006.01)
*H01L 23/498* (2006.01)
*H01L 23/00* (2006.01)

(52) U.S. Cl.
CPC ........ *H01L 21/8258* (2013.01); *H01L 23/481* (2013.01); *H01L 23/498* (2013.01); *H01L 24/13* (2013.01); *H01L 24/16* (2013.01); *H01L 24/73* (2013.01); *H01L 27/0605* (2013.01); *H01L 2224/1357* (2013.01); *H01L 2224/13147* (2013.01); *H01L 2224/16225* (2013.01); *H01L 2224/73257* (2013.01); *H01L 2924/1421* (2013.01)

(56) References Cited

U.S. PATENT DOCUMENTS

| | | | |
|---|---|---|---|
| 7,291,529 | B2 | 11/2007 | Slater et al. |
| 7,354,782 | B2 | 4/2008 | Mishra et al. |
| 7,768,075 | B2 * | 8/2010 | Yilmaz ................... H01L 24/14 257/772 |
| 7,851,909 | B2 | 12/2010 | Mishra et al. |
| 7,932,111 | B2 | 4/2011 | Edmond |
| 8,138,087 | B2 | 3/2012 | Morel et al. |
| 8,252,682 | B2 | 8/2012 | Yang et al. |
| 8,274,159 | B2 | 9/2012 | Mishra et al. |
| 8,513,686 | B2 | 8/2013 | Edmond |
| 8,803,313 | B2 | 8/2014 | Mishra et al. |
| 9,226,383 | B2 | 12/2015 | Mishra et al. |
| 9,780,738 | B2 * | 10/2017 | Ota ........................... H03F 3/16 |
| 10,103,233 | B1 * | 10/2018 | Khalil ................. H01L 29/41775 |
| 11,094,614 | B2 * | 8/2021 | Steinhoff ............ H01L 29/7395 |
| 2008/0169474 | A1 * | 7/2008 | Sheppard ................. H03H 3/08 257/E27.014 |
| 2010/0244193 | A1 | 9/2010 | Lin et al. |
| 2011/0024835 | A1 * | 2/2011 | Tiemeijer ............ H01L 23/4824 257/335 |
| 2011/0241074 | A1 | 10/2011 | Okamoto |
| 2012/0140432 | A1 | 6/2012 | Andrei |
| 2015/0303881 | A1 * | 10/2015 | Blednov ................. H03F 1/086 330/289 |
| 2017/0034913 | A1 * | 2/2017 | Mu ......................... H01L 23/66 |
| 2017/0372945 | A1 * | 12/2017 | Howard .................. H01L 21/84 |
| 2017/0372983 | A1 | 12/2017 | Howard ............... H01L 27/1203 |
| 2018/0323295 | A1 | 11/2018 | Okayasu et al. |
| 2019/0109222 | A1 * | 4/2019 | Liu ......................... H03F 3/211 |
| 2019/0173430 | A1 | 6/2019 | Krehbiel et al. |
| 2019/0326258 | A1 | 10/2019 | Hua et al. |
| 2019/0333878 | A1 * | 10/2019 | Wu ...................... H01L 23/5383 |
| 2020/0105653 | A1 * | 4/2020 | Elsherbini ............... H01L 24/02 |
| 2020/0395474 | A1 * | 12/2020 | Bothe ............... H01L 21/76897 |
| 2021/0111105 | A1 * | 4/2021 | Kim ..................... H02M 3/003 |
| 2021/0194434 | A1 | 6/2021 | Ladhani ................. H01L 23/66 |
| 2021/0202408 | A1 * | 7/2021 | Khalil ..................... H03F 3/195 |
| 2021/0313284 | A1 | 10/2021 | Noori et al. |

FOREIGN PATENT DOCUMENTS

| | | |
|---|---|---|
| EP | 1670055 A1 | 6/2006 |
| EP | 2518764 A2 | 10/2012 |
| JP | 4830092 B2 | 9/2011 |
| KR | 101288153 B1 | 7/2013 |
| KR | 101371907 B1 | 3/2014 |
| TW | I333278 B | 11/2010 |
| TW | 201519379 A | 5/2015 |
| WO | 2004061973 A1 | 7/2004 |
| WO | 2019066878 A1 | 4/2019 |
| WO | 2019170045 A1 | 9/2019 |

\* cited by examiner

METHODS FOR PILLAR CONNECTION ON FRONTSIDE AND PASSIVE DEVICE INTEGRATION ON BACKSIDE OF DIE

CROSS-REFERENCE TO RELATED APPLICATION

The present application is a continuation of and claims priority to U.S. patent application Ser. No. 16/889,432, filed Jun. 1, 2020, the entire contents of which are incorporated herein by reference.

FIELD

The present disclosure is directed to integrated circuit devices, and more particularly, to power amplifier devices, device packaging, and related fabrication methods.

BACKGROUND

Electrical circuits requiring high power handling capability while operating at high frequencies, such as R-band (0.5-1 GHz), S-band (3 GHz) and X-band (10 GHz), have in recent years become more prevalent. In particular, there is now a high demand for radio frequency ("RF") power amplifiers that are used to amplify RF signals at radio (including microwave) frequencies in a variety of applications, such as base stations for wireless communication systems, etc. The signals amplified by the RF power amplifiers often include signals that have a modulated carrier having frequencies in the megahertz (MHz) to gigahertz (GHz) range. These RF power amplifiers may need to exhibit high reliability, good linearity and handle high output power levels.

Many RF power amplifier designs utilize semiconductor switching devices as amplification devices. Examples of these switching devices include power transistor devices, such as field effect transistor (FET) devices including MOSFETs (metal-oxide semiconductor field-effect transistors), DMOS (double-diffused metal-oxide semiconductor) transistors, HEMTs (high electron mobility transistors), MESFETs (metal-semiconductor field-effect transistors), LDMOS (laterally-diffused metal-oxide semiconductor) transistors, etc.

RF amplifiers are typically formed as semiconductor integrated circuit chips. Most RF amplifiers are implemented in silicon or using wide bandgap semiconductor materials (i.e., having a band-gap greater than 1.40 eV), such as silicon carbide ("SiC") and Group III nitride materials. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical formulas in which one mole of nitrogen is combined with a total of one mole of the Group III elements.

RF transistor amplifiers may include one or more amplification stages, with each stage typically implemented as a transistor amplifier. In order to increase the output power and current handling capabilities, RF transistor amplifiers are typically implemented in a "unit cell" configuration in which a large number of individual "unit cell" transistor structures are arranged electrically in parallel. An RF transistor amplifier may be implemented as a single integrated circuit chip or "die," or may include a plurality of dies. A die or chip may refer to a small block of semiconducting material or other substrate on which electronic circuit elements are fabricated. When multiple RF transistor amplifier dies are used, they may be connected in series and/or in parallel.

Silicon-based RF amplifiers are typically implemented using LDMOS transistors, and can exhibit high levels of linearity with relatively inexpensive fabrication. Group III nitride-based RF amplifiers are typically implemented using HEMTs, primarily in applications requiring high power and/or high frequency operation where LDMOS transistor amplifiers may have inherent performance limitations.

In operation of HEMT devices, a two-dimensional electron gas (2DEG) is formed at the heterojunction of two semiconductor materials with different bandgap energies, where the smaller bandgap material has a higher electron affinity. The 2DEG is an accumulation layer in the smaller bandgap material and can contain a very high sheet electron concentration. Additionally, electrons that originate in the wider-bandgap semiconductor material transfer to the 2DEG layer, allowing high electron mobility due to reduced ionized impurity scattering. This combination of high carrier concentration and high carrier mobility can give the HEMT a very large transconductance and may provide a strong performance advantage over metal oxide semiconductor field effect transistors (MOSFETs) for high-frequency applications. High electron mobility transistors fabricated in Group III-nitride based material systems also have the potential to generate large amounts of radio frequency (RF) power because of the combination of material characteristics that includes the aforementioned high breakdown fields, wide bandgaps, large conduction band offset, and/or high saturated electron drift velocity.

RF amplifiers often include matching circuits or circuitry, such as impedance matching circuits, that are designed to improve the impedance match between the active transistor die (e.g., including MOSFETs, HEMTs, LDMOS, etc.) and transmission lines connected thereto for RF signals at the fundamental operating frequency, and harmonic termination circuits that are designed to at least partly terminate harmonic products that may be generated during device operation, such as second and third order harmonic products. The termination of the harmonic products also influences generation of intermodulation distortion products.

The RF transistor amplifier die(s) as well as the impedance matching and harmonic termination circuits may be enclosed in a device package. Integrated circuit packaging may refer to encapsulating one or more dies in a supporting case or package that protects the dies from physical damage and/or corrosion, and supports the electrical contacts for connection to external circuits. Electrical leads may extend from the package to electrically connect the RF amplifier to external systems and/or circuit elements such as input and output RF transmission lines and bias voltage sources.

The input and output matching circuitry in an integrated circuit device package typically include LC networks that provide at least a portion of an impedance matching circuit that is configured to match the impedance of the active transistor die to a fixed value. Typically, the input and output RF matching circuitry employ off-die components and implementations, which may increase the package foot print. Also, the connections within the packages, such as between the die and the off-die components, may rely on wire bonds. The geometry of such conventional connections may be difficult to control and/or may limit precision for more complex RF IC designs.

SUMMARY

According to some embodiments, an integrated circuit device includes a radio frequency ("RF") transistor amplifier die having a first surface, a second surface, a semiconductor layer structure that is between the first and second surfaces and includes a plurality of transistor cells adjacent the first surface, and terminals coupled to the transistor cells. At least one passive electronic component is on the second surface of the die and electrically connected to at least one of the terminals.

In some embodiments, the terminals may include an input terminal, an output terminal, and/or a ground terminal of a RF transistor amplifier that is defined by the transistor cells.

In some embodiments, the at least one passive electronic component may define at least a portion of an input impedance matching circuit, an output impedance matching circuit, and/or harmonic termination circuit for the RF transistor amplifier on the second surface of the die.

In some embodiments, the at least one passive electronic component may be or may include at least one integrated passive device (IPD) comprising a discrete capacitor, inductor, and/or resistor on the second surface of the die.

In some embodiments, a metal layer may extend on the second surface of the die electrically connecting the at least one passive electronic component to the at least one of the terminals.

In some embodiments, the metal layer may be a first metal layer, and an insulator layer may be provided on the first metal layer opposite the second surface. The at least one passive electronic component may be on the insulator layer opposite the first metal layer, and may include patterns of a second metal layer defining one or more discrete capacitors, inductors, and/or resistors.

In some embodiments, at least one conductive via may extend into the second surface of the die and the semiconductor layer structure to electrically connect the metal layer on the second surface of the die to the at least one of the terminals.

In some embodiments, the semiconductor layer structure may include a Group-III nitride material, and the die may be a silicon carbide substrate between the Group-III nitride material and the second surface.

In some embodiments, one or more conductive pillar structures may protrude from the first surface of the die and provide electrical connections to one or more of the terminals.

In some embodiments, a package substrate including one or more conductive connections may be provided. The one or more conductive pillar structures may attach the die to the package substrate adjacent the first surface of the die, and may electrically connect the one or more of the terminals to the one or more conductive connections.

According to some embodiments, an integrated circuit device includes a radio frequency ("RF") transistor amplifier die having a first surface, a second surface, a semiconductor layer structure that is between the first and second surfaces and includes a plurality of transistor cells adjacent the first surface, and terminals coupled to the transistor cells. One or more conductive pillar structures protrude from the first surface of the die and are electrically connected to one or more of the terminals. At least one conductive via extends into the second surface of the die and the semiconductor layer structure and is electrically to at least one of the terminals.

In some embodiments, the terminals may include an input terminal, an output terminal, and/or a ground terminal of a RF transistor amplifier that is defined by the transistor cells.

In some embodiments, the one or more conductive pillar structures may provide electrical connection to the input terminal and/or the output terminal, and the at least one conductive via may provide electrical connection to the ground terminal.

In some embodiments, the die may include a substrate between the semiconductor layer structure and the second surface of the die, the at least one conductive via may extend through the substrate, and the semiconductor layer structure may include one or more epitaxial layers on the substrate.

In some embodiments, the semiconductor layer structure may include a Group-III nitride material, and the substrate may be a silicon carbide substrate.

In some embodiments, a package substrate including one or more conductive connections may be provided. The one or more conductive pillar structures may attach the die to the package substrate adjacent the first surface of the die, and may electrically connect the one or more of the terminals to the one or more conductive connections.

In some embodiments, a package substrate including at least one conductive connection may be provided, and the die may be attached to the package substrate adjacent the second surface of the die. The at least one conductive via may electrically connect the at least one of the terminals to the at least one conductive connection.

In some embodiments, at least one passive electronic component may be provided on the second surface of the die. The at least one passive electronic component may be electrically connected to the at least one of the terminals by the at least one conductive via.

According to some embodiments, a method of fabricating an integrated circuit device includes forming a radio frequency ("RF") transistor amplifier structure having a first surface, a second surface, a semiconductor layer structure that is between the first and second surfaces and includes a plurality of transistor cells adjacent the first surface, a substrate between the semiconductor layer structure and the second surface, and terminals coupled to the transistor cells; forming one or more conductive pillar structures that protrude from the first surface to provide electrical connections to one or more of the terminals; and singulating the RF transistor amplifier structure to define a RF transistor amplifier die. The RF transistor amplifier die includes a portion of the substrate having a thickness of about 50 to about 200 microns or more, for example, about 75 to about 175 microns, about 100 to about 150 microns, about 200 microns to about 500 microns, or about 500 to about 800 microns.

In some embodiments, a sidewall of the die extending between the first and second surfaces may include a first portion adjacent the first surface having a surface characteristic that differs from a second portion adjacent the second surface.

In some embodiments, the method may include forming a trench in the semiconductor layer structure extending from the first surface toward the second surface through the semiconductor layer structure and into the substrate to define the first portion of the sidewall of the die.

In some embodiments, forming the trench may be performed before forming the one or more conductive pillar structures.

In some embodiments, singulating may include dicing or sawing through a bottom of the trench in the substrate to define the second portion of the sidewall of the die.

In some embodiments, the semiconductor layer structure may include a Group-III nitride material, and the substrate may include silicon carbide.

According to some embodiments, a method of fabricating an integrated circuit device includes forming a radio frequency ("RF") transistor amplifier structure comprising a first surface, a second surface, a semiconductor layer structure that is between the first and second surfaces and includes a plurality of transistor cells adjacent the first surface, and terminals coupled to the transistor cells; forming one or more conductive pillar structures that protrude from the first surface to provide electrical connections to one or more of the terminals; and forming at least one conductive via that extends into the second surface and through the semiconductor layer structure to provide electrical connection to at least one of the terminals.

In some embodiments, the RF transistor amplifier may include a substrate between the semiconductor layer structure and the second surface. Forming the at least one conductive via may include attaching the first surface to a wafer carrier; performing a thinning operation on the second surface to reduce a thickness of the substrate; and forming the at least one conductive via extending into the second surface responsive to the thinning operation and with the first surface attached to the wafer carrier.

In some embodiments, forming the one or more conductive pillar structures may be performed before attaching the first surface to the wafer carrier.

In some embodiments, the wafer carrier may be a first wafer carrier. Forming the one or more conductive pillar structures may include detaching the first surface from the first wafer carrier; attaching the second surface to a second wafer carrier; and forming the one or more conductive pillar structures on the first surface with the second surface attached to the second wafer carrier.

In some embodiments, the method may further include forming at least one passive electronic component on the second surface with the first surface attached to the wafer carrier. The at least one passive electronic component may be electrically connected to the at least one of the terminals by the at least one conductive via.

In some embodiments, forming the at least one passive electronic component may include forming a first metal layer on the second surface responsive to the thinning operation; forming an insulator layer on the first metal layer opposite the second surface; and forming and patterning a second metal layer on the insulator layer opposite the first metal layer. The at least one passive electronic component may include patterns of the second metal layer defining one or more discrete capacitors, inductors, and/or resistors.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

DETAILED DESCRIPTION OF EMBODIMENTS

Figure 1:
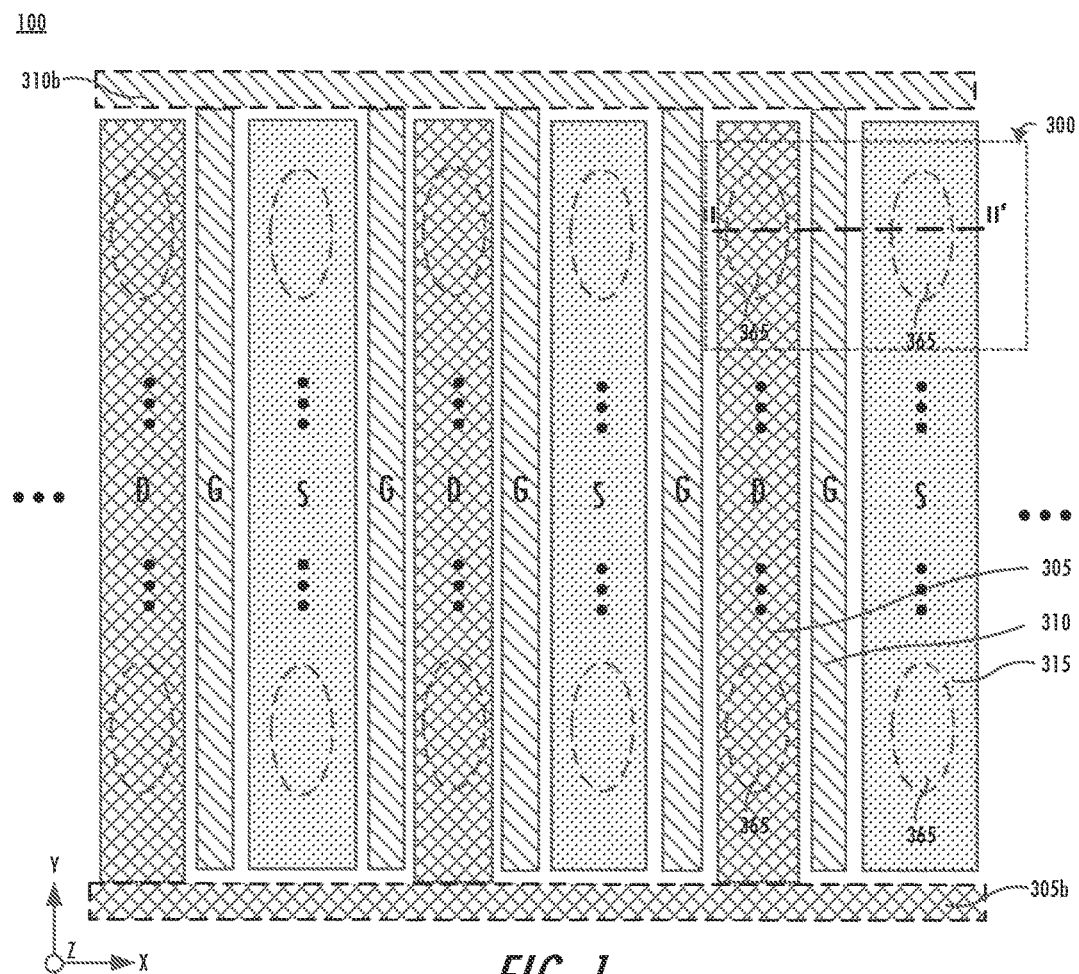
FIG. 1 is a schematic plan view of a RF transistor amplifier die or device according to some embodiments of the present disclosure.

Embodiments of the present disclosure are directed to devices and fabrication methods that can reduce or eliminate wire bonds in integrated circuit device packages. In addition to imposing limitations on package size and assembly, the wire bonds may introduce undesired series inductance that can reduce or negate the effectiveness of matching circuits (including input/output impedance matching and/or harmonic termination circuits), particularly in higher frequency RF applications.

As such, some embodiments of the present disclosure provide integrated devices and fabrication methods that use electrical connection structures on the front side or front surface of an RF transistor amplifier die or device, such as conductive pillars (also referred to herein as frontside pillar structures, or frontside pillars). As used herein, the 'front side' or 'front surface' of a die or device may be adjacent the active transistor cells in the semiconductor layer structure of the device, while the 'back side' or 'back surface' of the die or device may be opposite the front side (and in some embodiments may include the substrate on which the semiconductor layer structure is formed or otherwise provided). The frontside pillars may be conductive structures (including metal-plated or other metal structures) that can be integrated on-wafer, and can improve control over geometry with design flexibility as to the respective locations or positioning of the frontside pillars. The frontside pillars can connect one or more terminals of the device (e.g., the source, drain, and/or gate terminals of a transistor die) to a printed circuit board (PCB), redistribution layer (RDL) structure, and/or other package substrate, including thermally enhanced packages (e.g., a TEPAC or T3PAC package), for external connections (e.g., input, output, and/or ground connections, also referred to as 'off-chip' connections), reducing or eliminating wire bonds.

Further embodiments of the present disclosure provide integrated devices and fabrication methods that use the back side of the die to integrate passive electronic components or devices (e.g., discrete capacitors, inductors and resistors), for example, to reduce or eliminate complexities associated with off-chip connections (e.g., using wire bonds) to matching circuitry. The addition of a patterned metal layer and an insulator on the back side of the die allows for higher integration levels, and provide the building blocks needed for designing a wide variety of passive components. In some embodiments, the passive components or circuits on the back side of the die can be connected to the active transistor devices on the front side by one or more conductive through substrate vias extending from the back side toward the front side (also referred to herein as backside vias). In some embodiments, the passive devices may be provided on the back side of the die in conjunction with the frontside pillars on the front side of the die. Embodiments described herein can thus improve circuit precision and reduce package size.

Several design trade-offs were considered in integrating the frontside pillars in devices and fabrication methods accordance with embodiments of the present disclosure, which are described in detail below with reference to the accompanying figures. For example, all three FET terminals (e.g., source/ground, gate and drain) may be routed to the same side of the die (e.g., the front side), in some embodiments, while such an arrangement may not be optimal in some embodiments. In RF IC designs that may require a backside ground plane, conductive through substrate vias may be used (e.g., for connection to the FET source terminals). In some embodiments, the frontside pillar connections may eliminate the need for backside via connections. In some embodiments, backside via connections may not be required, but the singulation process may impose limitations on the substrate thickness.

Figure 2:
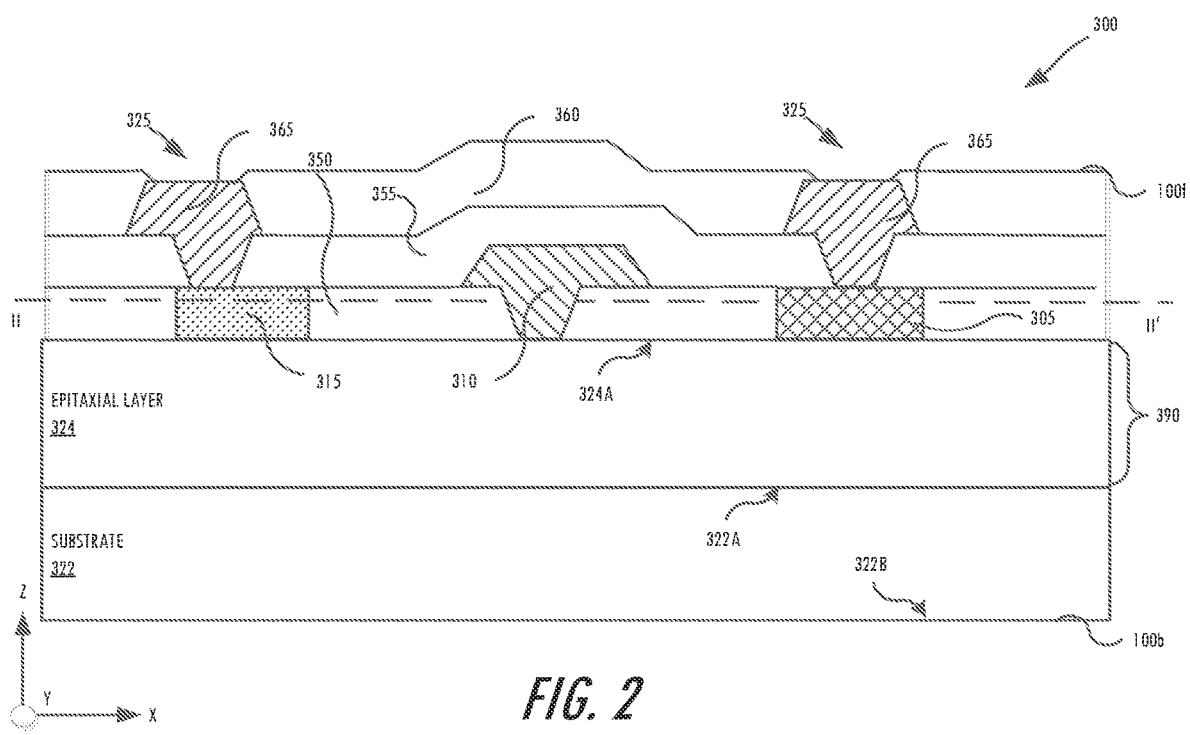
FIG. 2 is a schematic cross-sectional view of a transistor structure of the RF transistor amplifier die taken along line II-II' of FIG. 1.

FIG. 1 is a schematic plan view of a portion of a semiconductor die 100 according to embodiments of the present disclosure. The die 100 may include transistor cells of a power transistor device, for example, an RF power amplifier. FIG. 2 is a schematic cross-sectional view of a unit cell transistor structure (also referred to herein as a transistor structure or transistor cell) 300 of the device or die 100 taken along line II-II' of FIG. 1.

As shown in FIGS. 1 and 2, a semiconductor layer structure 390, such as a semiconductor structure for a Group III nitride semiconductor HEMT or MOSFET, may be formed on a substrate 322 such as a silicon carbide substrate or a sapphire substrate. The substrate 322 may be a semi-insulating silicon carbide substrate that may be, for example, the 4H polytype of silicon carbide. Other silicon carbide candidate polytypes may include the 3C, 6H, and 15R polytypes. The substrate 322 may be a High Purity Semi-Insulating (HPSI) substrate, available from Cree, Inc. The term 'semi-insulating' is used descriptively herein, rather than in an absolute sense.

As used herein, the term "Group III-nitride" refers to those semiconducting compounds formed between nitrogen (N) and the elements in Group III of the periodic table, usually aluminum (Al), gallium (Ga), and/or indium (In). The term also refers to ternary and quaternary (or higher) compounds such as, for example, AlGaN and AlInGaN. As is well understood by those in this art, the Group III elements can combine with nitrogen to form binary (e.g., GaN), ternary (e.g., AlGaN, AlInN), and quaternary (e.g., AlIn-GaN) compounds. These compounds all have empirical formulas in which one mole of nitrogen is combined with a total of one mole of the Group III elements.

In some embodiments of the present disclosure, the silicon carbide bulk crystal of the substrate 322 may have a resistivity equal to or higher than about $1 \times 10^5$ ohm-cm at room temperature. Examples of SiC substrates that may be used in some embodiments of the present disclosure are manufactured by, for example, Cree, Inc., of Durham, N.C., the assignee of the present disclosure, and methods for producing such substrates are described, for example, in U.S. Pat. No. Re. 34,861, U.S. Pat. Nos. 4,946,547, 5,200,022, and 6,218,680, the disclosures of which are incorporated by reference herein in their entireties. It is to be understood that, although silicon carbide may be employed as a substrate 322, embodiments of the present disclosure may utilize any suitable substrate for the substrate 322, such as sapphire ($Al_2O_3$), aluminum nitride (AlN), aluminum gallium nitride (AlGaN), gallium nitride (GaN), silicon (Si), GaAs, LGO, zinc oxide (ZnO), LAO, indium phosphide (InP), and the like.

The substrate 322 may be a silicon carbide wafer, and the device 100 may be formed, at least in part, via wafer-level processing, and the wafer may then be diced to provide a device 100 including plurality of individual or unit cell transistors (respectively designated herein as 300 or 300-$n$, where n is an integer). In some embodiments, the thickness of the substrate 322 (e.g., in a vertical Z direction in FIG. 2) may be greater than 100 μm, greater than 200 μm, or greater than 400 μm.

In some embodiments, e.g., as described below with reference to FIGS. 3A-3D, 5A-5F, and 7A-7G, the transistor structure 300 may include a thinned substrate 322'. In some embodiments, the thickness of the substrate 322' (e.g., in a vertical Z direction in FIG. 2) may be 100 μm or less. In some embodiments, the thickness of the substrate 322' may be 75 μm or less. In some embodiments, the thickness of the substrate 322' may be 50 μm or less.

The semiconductor layer structure 390 is formed on a surface of the substrate 322 (or on the optional layers described further herein). In the illustrated examples, the semiconductor layer structure 390 is formed by epitaxial growth, and thus includes one or more epitaxial layers 324. Techniques for epitaxial growth of Group III nitrides have been described in, for example, U.S. Pat. Nos. 5,210,051, 5,393,993, and 5,523,589, the disclosures of which are also incorporated by reference herein in their entireties.

Silicon carbide has a much closer crystal lattice match to Group III nitrides (which may be employed in the semiconductor layer structure 390) than does sapphire ($Al_2O_3$), which may be a common substrate material for Group III nitride devices. The closer lattice match may result in Group III nitride films of higher quality than those generally available on sapphire. Silicon carbide also has a relatively high thermal conductivity, and as such, the total output power of Group III nitride devices formed on silicon carbide may not be as limited by thermal dissipation of the substrate as similar devices formed on sapphire and/or silicon. Also, semi-insulating silicon carbide substrates may provide for device isolation and reduced parasitic capacitance.

While semiconductor layer structure 390 is shown with reference to one or more epitaxial layers 324 for purposes of illustration, semiconductor layer structure 390 may include additional layers/structures/elements such as a buffer and/or nucleation layer(s) on or between substrate 322 and the one or more epitaxial layers 324, and/or a cap layer on an upper surface 324A of the epitaxial layer 324. For example, an AlN buffer layer may be formed on the upper surface 322A of the substrate 322 to provide an appropriate crystal structure transition between the silicon carbide substrate 322 and the remainder of the layers of the transistor structure 300. Additionally, strain balancing transition layer(s) may also and/or alternatively be provided as described, for example, in commonly assigned U.S. Pat. No. 7,030,428, the disclosure of which is incorporated herein by reference as if set forth fully herein. The optional buffer/nucleation/transition layers may be deposited by metal-organic chemical vapor deposition (MOCVD), molecular beam epitaxy (MBE), and/or hydride vapor phase epitaxy (HVPE).

Still referring to FIGS. 1 and 2, at the front side 100f of the die 100, a source contact 315 and a drain contact 305 may be formed on a surface 324A of the epitaxial layer 324 and may be laterally spaced apart from each other. The source region of the unit cell transistor 300 is the portion of the semiconductor layer structure 390 that is directly underneath the source contact 315, and the drain region the unit cell transistor 300 is the portion of the semiconductor layer structure 390 that is directly underneath the drain contact 305. A gate contact 310 may be formed on the epitaxial layer 324 between the source contact 315 and the drain contact 305. The material of the gate contact 310 may be chosen based on the composition of the epitaxial layer 324, and may, in some embodiments, be a Schottky contact. Some materials capable of making a Schottky contact to a Group III nitride based semiconductor material may be used, such as, for example, nickel (Ni), platinum (Pt), nickel silicide (NiSi$_x$), copper (Cu), palladium (Pd), chromium (Cr), tungsten (W) and/or tungsten silicon nitride (WSiN).

The source contact 315 and/or the drain contact 305 may include a metal that can form an ohmic contact to a Group III nitride based semiconductor material. Suitable metals may include refractory metals, such as Ti, W, titanium tungsten (TiW), silicon (Si), titanium tungsten nitride (TiWN), tungsten silicide (WSi), rhenium (Re), Niobium (Nb), Ni, gold (Au), aluminum (Al), tantalum (Ta), molybdenum (Mo), NiSi$_x$, titanium silicide (TiSi), titanium nitride (TiN), WSiN, Pt and the like. Thus, the source contact 315 and/or the drain contact 305 may contain an ohmic contact portion in direct contact with the epitaxial layer 324 (e.g., the barrier layer in a HEMT device). In some embodiments, the source contact 315 and/or the drain contact 305 may be formed of a plurality of layers to form an ohmic contact that may be provided as described, for example, in commonly assigned U.S. Pat. Nos. 8,563,372 and 9,214,352, the disclosures of which are hereby incorporated herein in their entirety by reference.

In some embodiments, the transistor cell 300 may be a HEMT structure, and the epitaxial layer structure 324 may include a channel layer formed on a surface 322A of the substrate 322 and a barrier layer formed on a surface of the channel layer. The channel layer may have a bandgap that is less than the bandgap of the barrier layer and the channel layer may also have a larger electron affinity than the barrier layer. The channel layer and the barrier layer may include Group III-nitride based materials. As discussed above with respect to the conventional HEMT device, a 2DEG layer is induced in the channel layer at a junction between the channel layer and the barrier layer. The 2DEG layer acts as a highly conductive layer that allows conduction between the source and drain regions of the device that are beneath the source contact 315 and the drain contact 305, respectively. HEMT structures including substrates, channel layers, barrier layers, and other layers are discussed by way of example in U.S. Pat. Nos. 5,192,987, 5,296,395, 6,316,793, 6,548,333, 7,544,963, 7,548,112, 7,592,211, 7,615,774, 7,548,112, and 7,709,269, the disclosures of which are hereby incorporated herein in their entirety by reference.

As will be understood by one of ordinary skill in the art, the transistor cell 300 (e.g., a HEMT, MOSFET, LDMOS, etc.) may be defined by the active region between the source contact 315 and the drain contact 305 under the control of a gate contact 310. In some embodiments, the source contact 315, the drain contact 305, and the gate contact 310 may be formed as a plurality of source contacts 315, drain contacts 305, and gate contacts 310 alternately arranged on the substrate 322, with a gate contact 310 disposed between adjacent drain contacts 305 and source contacts 315 to form a plurality of transistor cells 300. As illustrated in FIG. 1, the device 100 may include adjacent transistor cells 300 sharing a source contact 315. The cross-sectional views herein illustrate a subset of the source contacts 315, drain contacts 305, and gate contacts 310 for ease of discussion, but it will be understood that the device 100 may have additional structures, including additional source contacts 315, drain contacts 305, and gate contacts 310, that are not illustrated.

Typically, hundreds, or more commonly, thousands of unit cells such as unit cell 300 may be formed on the semiconductor substrate and electrically connected in parallel to provide the RF transistor amplifier die or device 100. In some embodiments, the die 100 may include multiple transistor cells 300, which may be connected in parallel to device terminals or electrodes (e.g., an input terminal, an output terminal, and a ground terminal). For example, each of the gate 310, drain 305, and source 315 contacts may extend in a first direction (e.g., the Y-direction) to define gate, drain, and/or source 'fingers', which may be connected by one or more respective buses (e.g., by a gate bus 310b and a drain bus 305b; shown in phantom in FIG. 1) on an upper surface 324A of the semiconductor layer structure 390. The gate fingers 310, drain fingers 305, and source fingers 315 (and connecting buses) may define part of gate-, drain-, and source-connected electrodes of the device 100, respectively, as defined by a top or frontside metallization structure. Dielectric layers that isolate the various conductive elements of the frontside metallization structure from each other are not shown in FIG. 1 to simplify the drawing. Since the gate fingers 310 are electrically connected to a common gate bus 310b, the drain fingers 305 are electrically connected to a common drain bus 305b, and the source fingers 315 are electrically connected together (e.g., through respective via openings 335 and a backside metal layer 345 described herein), it can be seen that the unit cell transistors 300 are all electrically connected together in parallel.

One of the terminals of the RF transistor amplifier die or device 100 (e.g., a source terminal connected to the source contact(s) 315) may be configured to be coupled to a reference signal such as, for example, an electrical ground. In some embodiments, a conductive through substrate via connection or structure (e.g., a backside via 346 formed in through substrate via openings 335 as described herein) may extend through the substrate 322 or 322' and epitaxial layer 324 to couple the source contact 315 to ground. In other embodiments, a ground connection to one of the terminals of the RF transistor amplifier die or device 100 (e.g., the source terminal) may be provided outside the active area, e.g., in a peripheral area of the die 100. In some embodiments, a backmetal layer 345 on the back side 100b of the die 100 may provide a backside ground plane, for example, in applications where proximity to ground may be desired.

As shown in FIG. 2, the transistor structure 300 may further include one or more dielectric or insulating layers, illustrated as 350, 355, and 360 adjacent the front side 100f.

The first insulating layer 350 may directly contact the upper surface of the semiconductor layer structure 390 (e.g., contact the upper surface 324A of the epitaxial layer 324). The second insulating layer 355 may be formed on the first insulating layer 350, and the third insulating layer 360 may be formed on the second insulating layer 355. It will also be appreciated that fewer or more than three insulating layers may be included in some embodiments. One or more of the insulating layers 350, 355, and/or 360 may serve as passivation layers for the transistor structure 300. The insulating layers 350, 355, 360 may be dielectric material, such as silicon nitride ($Si_xN_y$), aluminum nitride (AlN), silicon dioxide ($SiO_2$), silicon oxynitrides, and/or other suitable protective material, for example, magnesium oxide, scandium oxide, aluminum oxide and/or aluminum oxynitride. More generally, the insulating layers 350, 355, 360 may be a single layer or may include multiple layers of uniform and/or non-uniform composition, and/or may be sufficiently thick so as to protect the underlying epitaxial layer(s) 324 during a subsequent anneal of ohmic contacts (e.g., to provide the source contacts 315 and/or the drain contacts 305).

The source contact 315, the drain contact 305, and the gate contact 310 may be formed in the first insulating layer 350 adjacent the front side 100f of the die 100. In some embodiments, at least a portion of the gate contact 310 may be on a surface of the first insulating layer 350. In some embodiments, the gate contact 310 may be formed as a T-shaped gate and/or a gamma gate, the formation of which is discussed by way of example in U.S. Pat. Nos. 8,049,252, 7,045,404, and 8,120,064, the disclosures of which are hereby incorporated herein in their entirety by reference. The second insulating layer 355 may be formed on the first insulating layer 350 and on portions of the drain contact 305, gate contact 310, and source contact 315.

Respective metal contacts 365 may be formed extending through openings in the second insulating layer 355 to contact one or more of the contacts 305, 310, 315, for example, the source and drain contacts 315 and 305. For example, the second insulating layer 355 may be patterned to form windows which expose the source contacts 315 and/or the drain contacts 305 for placement of the metal contacts 365. The windows may be etched utilizing a patterned mask and a low-damage etch with respect to the source contacts 315 and/or the drain contacts 305. Conductive metal may be formed on the exposed portions of the source contacts 315 and/or the drain contacts 305 to form the metal contacts 365.

The metal contacts 365 may directly contact respective ones of the contacts 305, 310, 315 of the transistor cell 300 at the front side 100f of the die 100. In the example of FIGS. 1 and 2, the metal contacts 365 are provided on the drain contact 305 and source contact 315. However, in other embodiments, the metal contacts 365 may be provided on all three FET terminals (source, gate and drain) at the front side 100f of the die 100. Also, metal contacts 365 may provide connections to the gate bus 310b and the drain bus 305b, for example, to provide external input/output connections (e.g., to provide input signals to the gate 310 and output signals from the drain 305). In particular, in some embodiments, the metal contacts 365 may provide connections between the gate bus 310b and the drain bus 305b and respective landing/contact pads for respective wirebonds that provide the input/output connections.

The metal contacts 365 may contain metal or other highly conductive material, including, for example, copper, cobalt, gold, and/or a composite metal. For ease of illustration, the second insulating layer 355, the third insulating layer 360, and the metal contacts 365 are not illustrated in FIG. 1. The third insulating layer 360 (of similar or different composition than the insulating layers 350 and/or 355) may be formed on the metal contacts 365 as a final passivation layer, which may be patterned to define openings 325 that expose the metal contacts 365 for electrical connection, e.g., for "off-chip" input or and/or output connections to one or more external devices, and/or for ground connections. The metal contacts 365 may thus define input (e.g., gate), output (e.g., drain), and/or ground (e.g., source) contact pads or terminals, which may be directly or indirectly connected to corresponding terminals of one or more transistor structures 300 (e.g., gate 310, drain 305, and source 315 terminals of a FET, such as a HEMT or LDMOS transistor) of the die 100.

Further operations for fabricating frontside pillars, backside vias, and/or backside passive devices in accordance with embodiments of the present disclosure are described herein with reference to the transistor structure 300 of FIG. 2.

FIGS. 3A-3D are cross-sectional views illustrating methods of fabricating transistor structures including frontside pillar structures according to some embodiments of the present disclosure. In particular, the operations of FIGS. 3A-3D illustrate a process sequence for forming devices 100 including transistor cells 300 without conductive through substrate via connections to the back side of the devices, using a bulk back grinding process to reduce the thickness of the substrate 322 for die singulation.

Figure 3A:
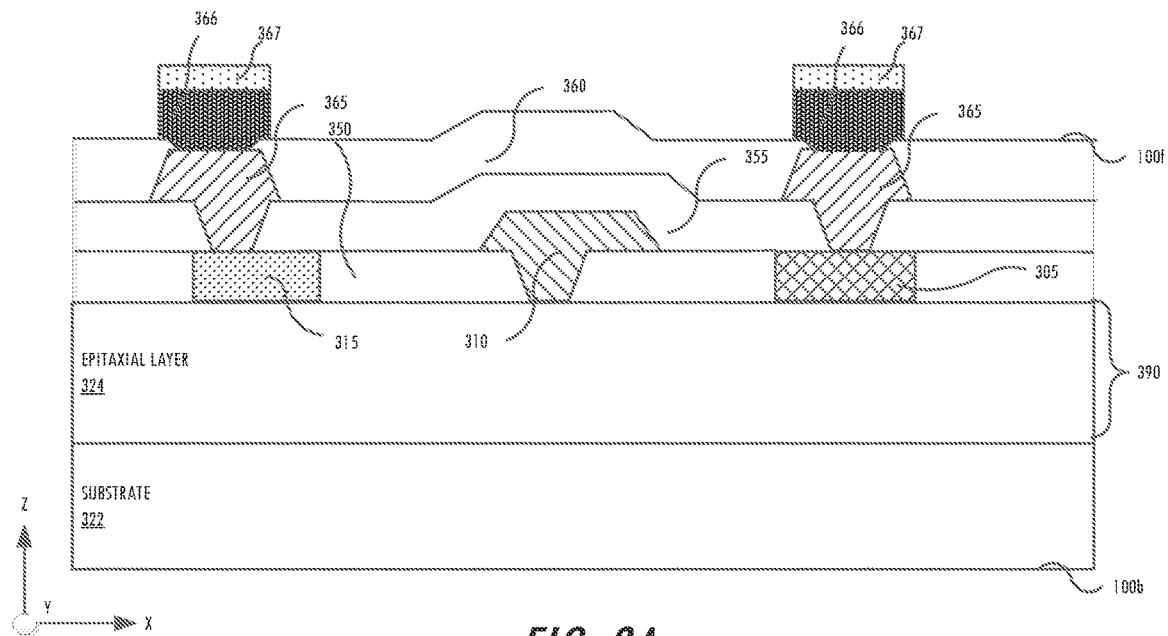
FIGS. 3A, 3B, 3C, and 3D are cross-sectional views illustrating methods of fabricating transistor structures including frontside pillar structures according to some embodiments of the present disclosure.

Referring now to FIG. 3A, after exposing the metal contacts 365 for off-chip connections in FIG. 2, respective conductive connections 366 (referred to herein as frontside connections or pillars) are formed on the metal contacts 365 on the front side 100f of the die 100. The frontside pillars 366 may have oval or circular shapes (e.g., similar or corresponding to the openings 325 exposing the metal contacts 365) in plan view. The frontside pillars 366 may be relatively thick conductive plated structures in some embodiments. For example, the frontside pillars 366 may be Cu— or other metal-plated structures. The frontside pillars 366 may thus provide electrical connections between one or more terminals of the device 100 (e.g., input, output, ground) and one or more external devices, for example, as a 'flip-chip' (where the device 100 is attached and electrically connected to a substrate or device(s) thereon by the pillars 366 adjacent the front side 100f of the device 100) and/or in a stacked multi-chip package. As shown in FIG. 3A, solder layers 367 may be provided on the frontside pillars 366 for electrical connection and/or attachment. In addition, depending on the package integration, the frontside pillars 366 may provide some chip-to-chip or chip-to-board separation, increase heat dissipation from the front side 100f of the device 100, increase mechanical strength, and/or (particularly in a 'flip-chip' package) increase design flexibility by allowing the placement of the connection pads or pillars away from the edges or periphery of the die 100.

Figure 3B:
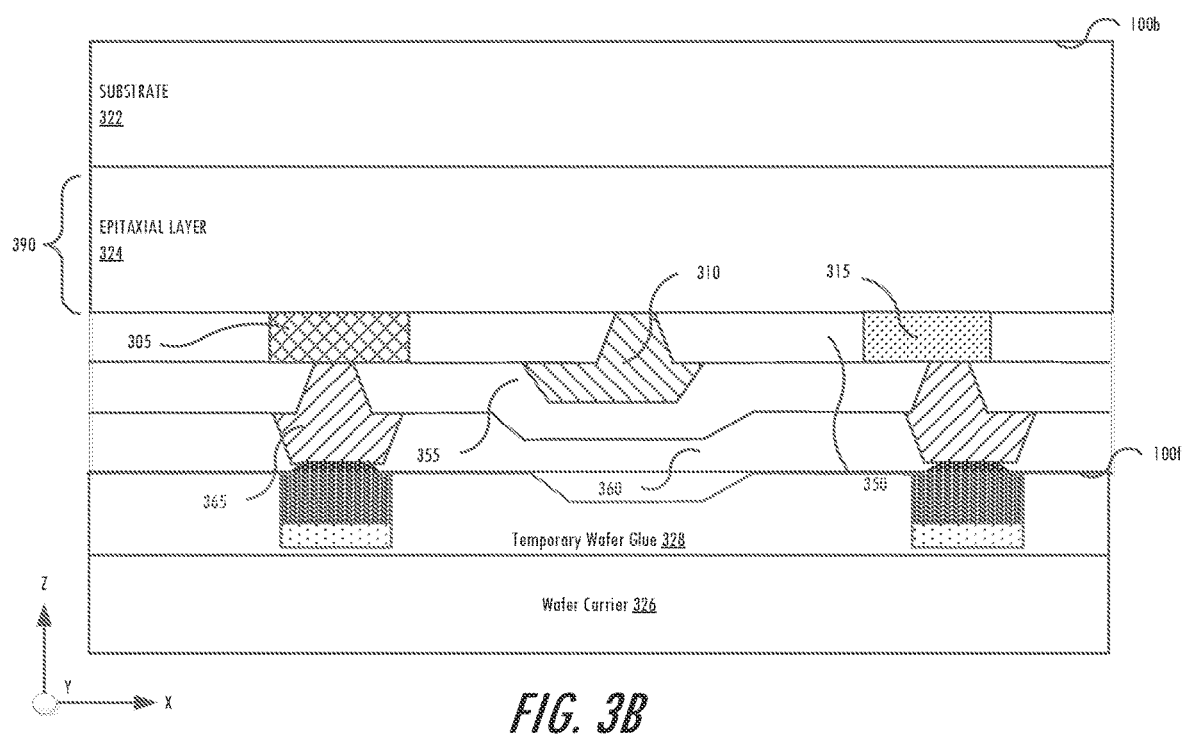

As shown in FIG. 3B, the front side 100f of the device 100 including the frontside pillars 366 protruding therefrom is 'flipped' and attached (front side down) to a wafer carrier 326, for example, by temporary wafer glue 328. The wafer carrier 326 may be any substrate or structure that is configured to increase stiffness and thus support and protect the frontside pillars 366 during subsequent fabrication processes.

In particular, the device or die 100 may be one of a plurality of dies formed on a common wafer, and thus, fabrication of the device 100 may include singulation from the other dies on the wafer, e.g., by a dicing or sawing process. Depending on the material of the substrate 322, singulation may be eased by reducing the thickness of the substrate 322. For example, in some embodiments the substrate 322 may be material (such as silicon carbide) having a hardness that may make singulation more difficult as thickness increases.

Figure 3C:
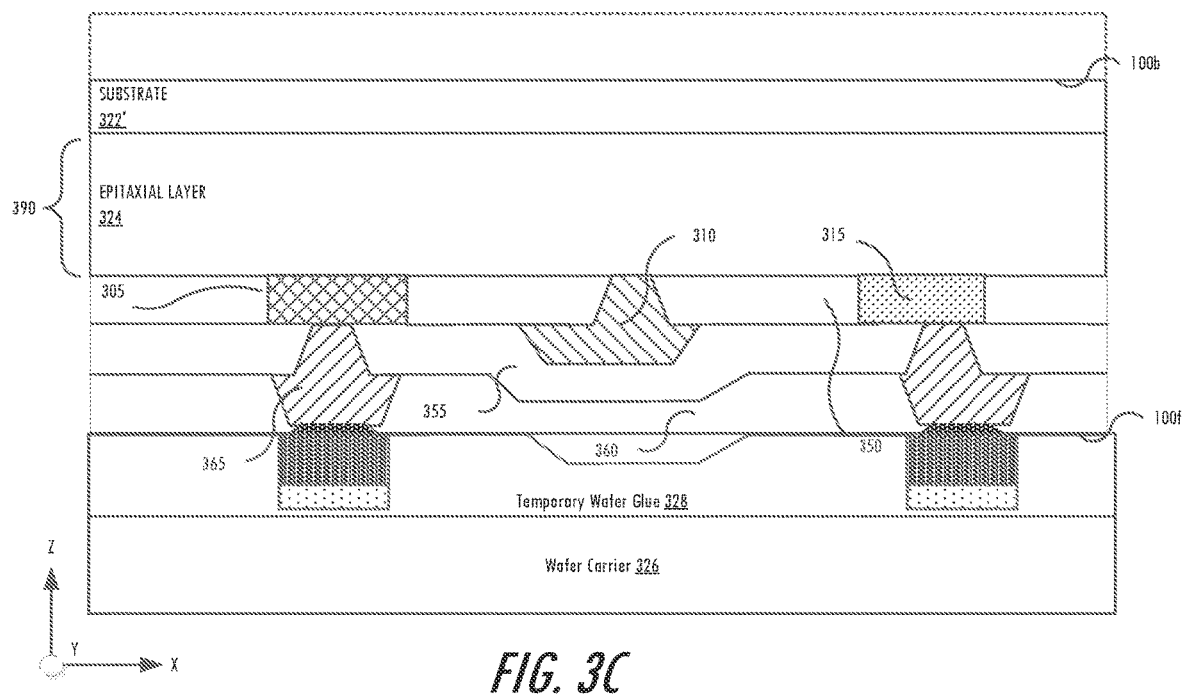

Accordingly, as shown in FIG. 3C, a thickness of the substrate 322 is reduced for singulation. In some embodiments, the thickness of the substrate 322 may be reduced using a grinder, such as an in-feed or creep feed grinder. In other embodiments, the thickness of the substrate 322 may be reduced using lapping, chemical or reactive ion etching or combinations of these approaches with or without grinding. In still other embodiments, etching may be used to treat the back side of the substrate 322 to reduce damage to the substrate 322 that may result from the thinning operation. Methods of thinning a wafer are described, for example, in commonly assigned U.S. Pat. Nos. 7,291,529, 7,932,111; 7,259,402; and 8,513,686, the disclosures of which are incorporated herein by reference in their entirety. In some embodiments, the substrate 322 may be thinned to a thickness of between about 40 μm to about 100 μm. In other embodiments, the substrate 322 is thinned to a thickness of between about 50 μm to about 75 μm.

Figure 3D:
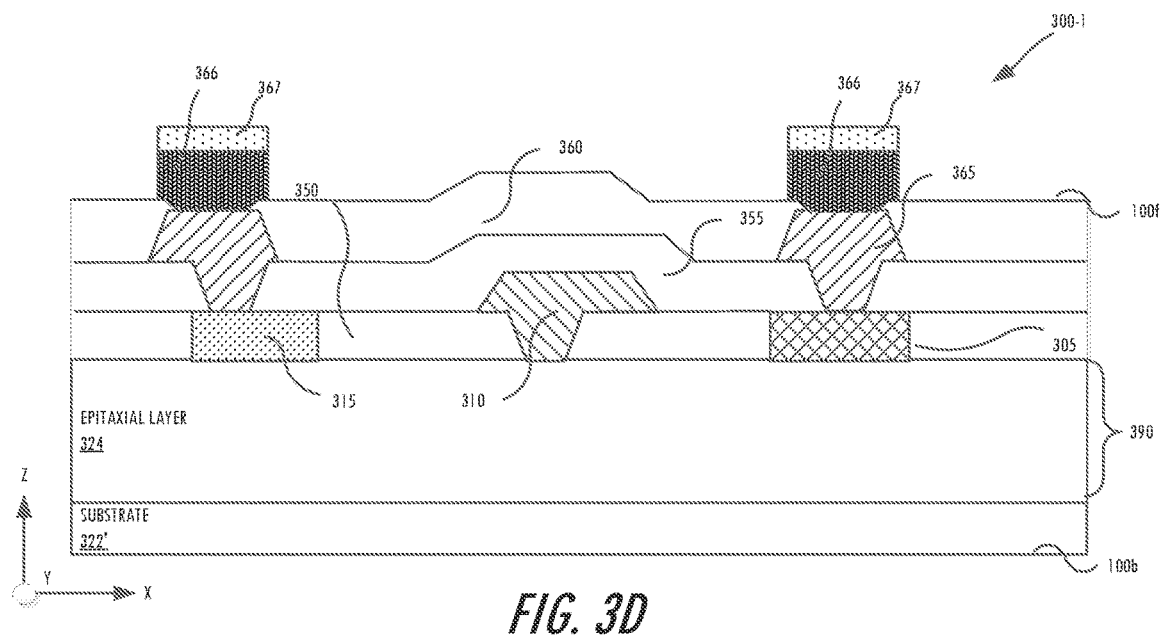
Figure 10:
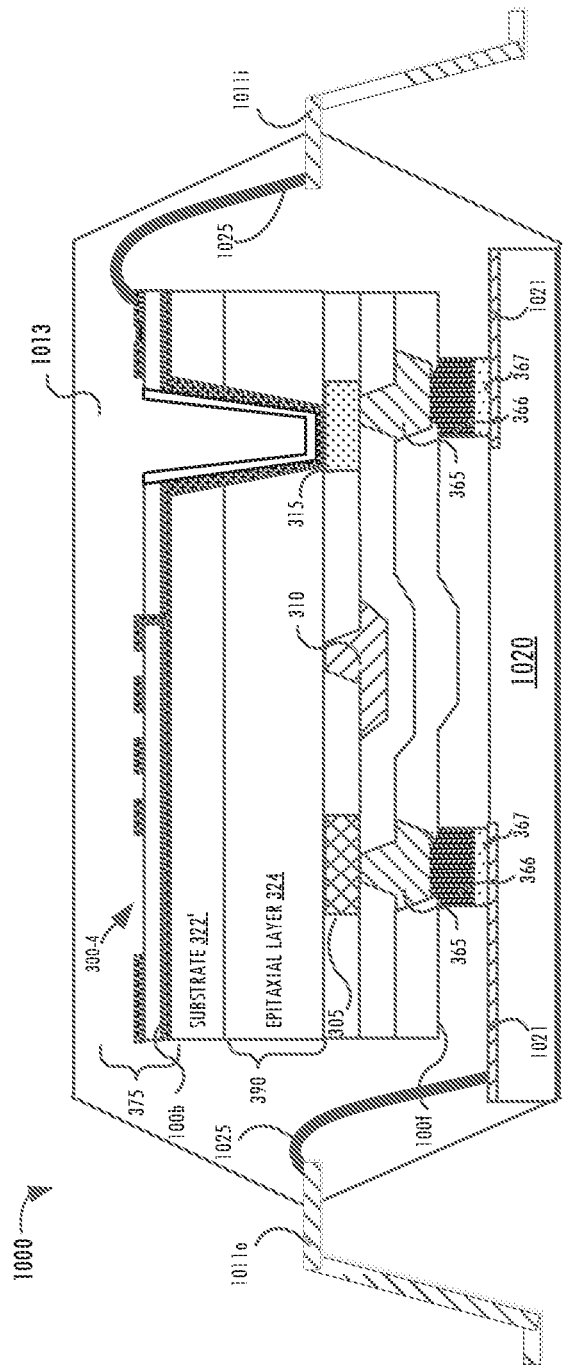
FIGS. 10, 11, and 12 are cross-sectional views illustrating examples of device packages including RF transistor amplifier dies or devices including transistor structures according to some embodiments of the present disclosure.
Figure 11:
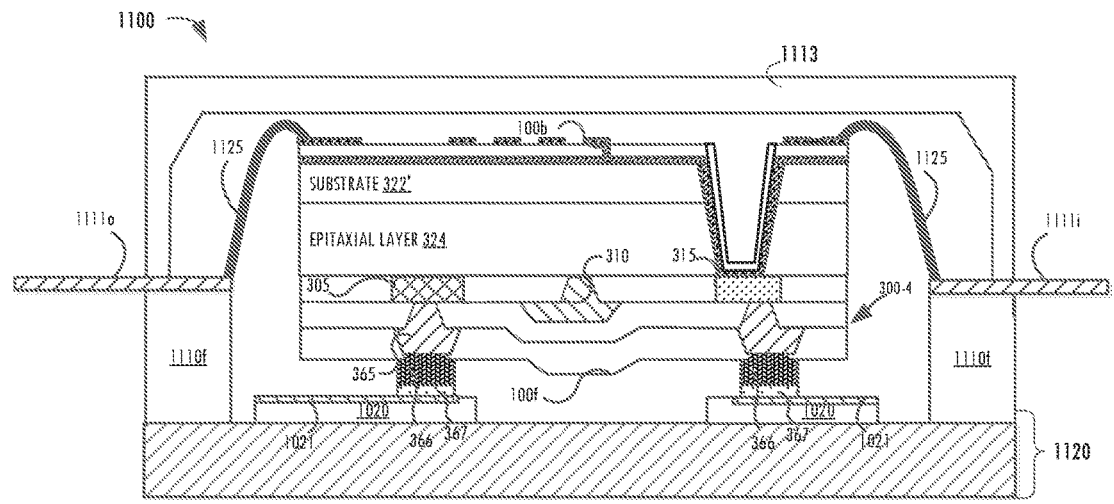
Figure 12:
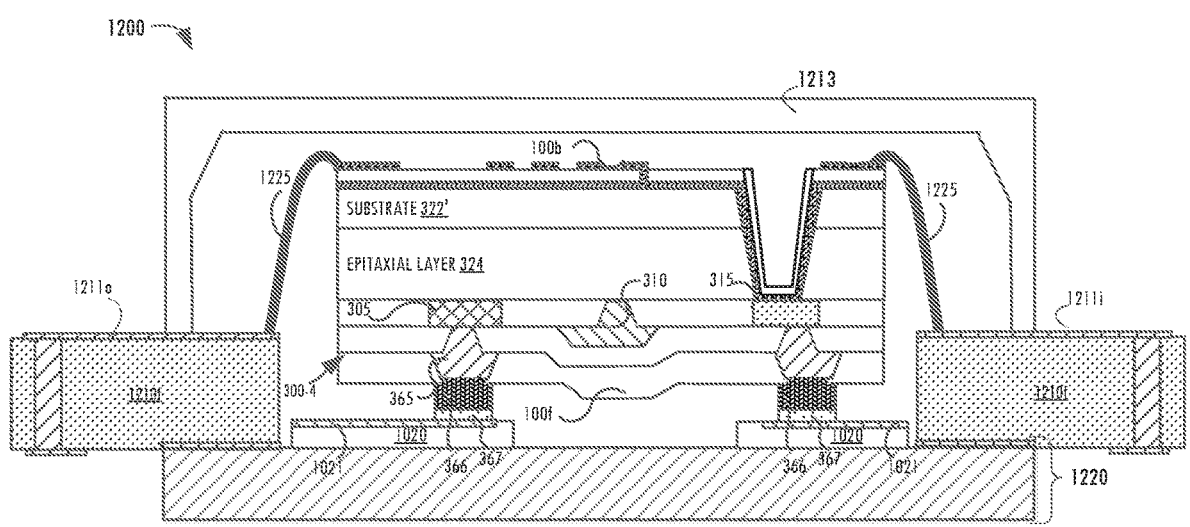

The wafer carrier 326 and/or the attachment thereto by the temporary glue 328 supports and protects the frontside pillars 366 of the device 100 from stresses induced by the thinning of the substrate 322. The substrate 322' thereby has a reduced but substantially uniform thickness due to the backside grinding or other thinning process. As shown in FIG. 3D, after the thinning of the substrate 322', the device 100 including transistor structures 300-1 is de-mounted or otherwise detached from the wafer carrier 326 and is ready for singulation and mounting (e.g., in a package as illustrated in FIGS. 10-12) in subsequent processes.

Figure 4A:
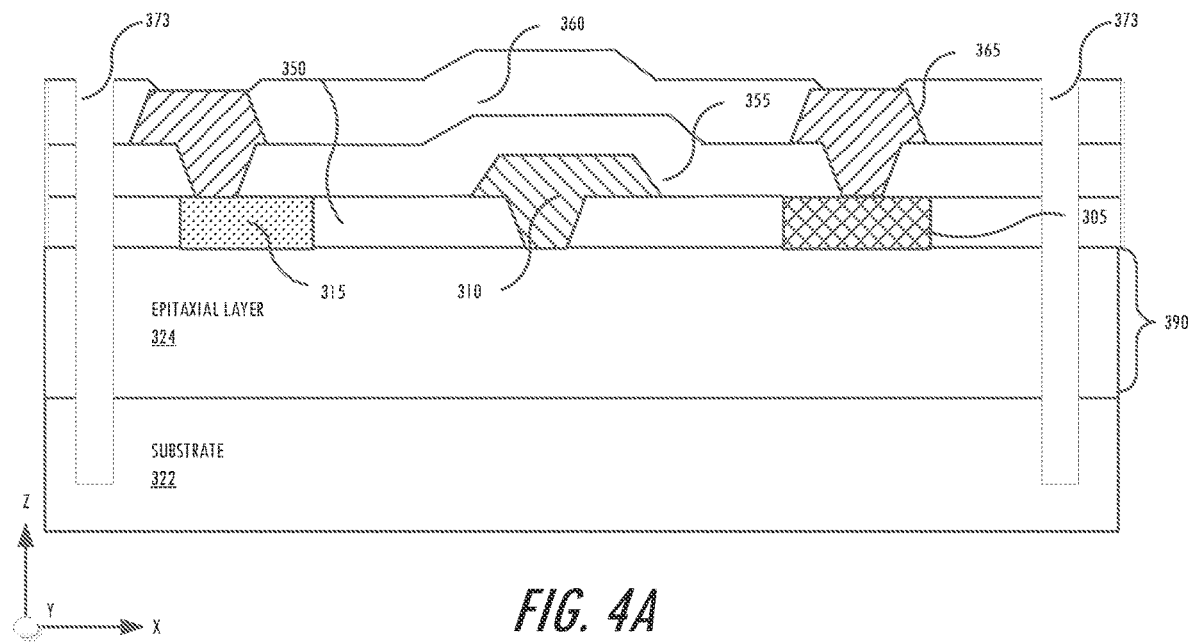
FIGS. 4A, 4B, and 4C are cross-sectional views illustrating methods of fabricating transistor structures including frontside pillar structures and trenches for die singulation according to some embodiments of the present disclosure.
Figure 4B:
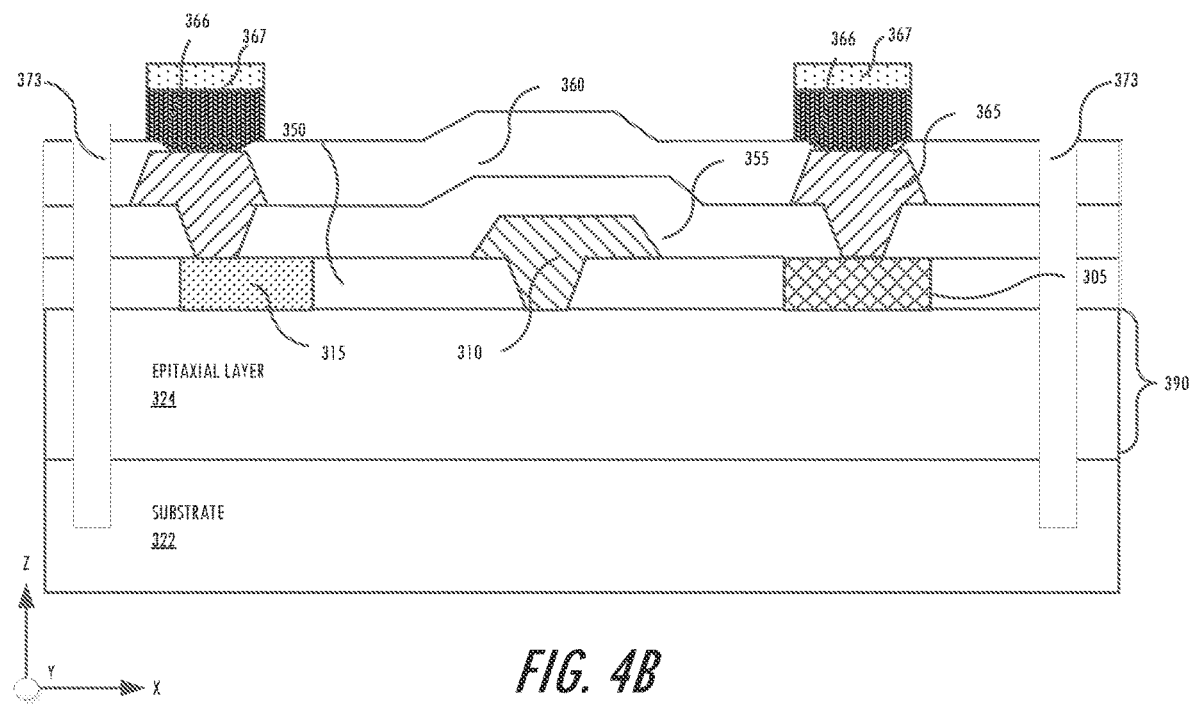
Figure 4C:
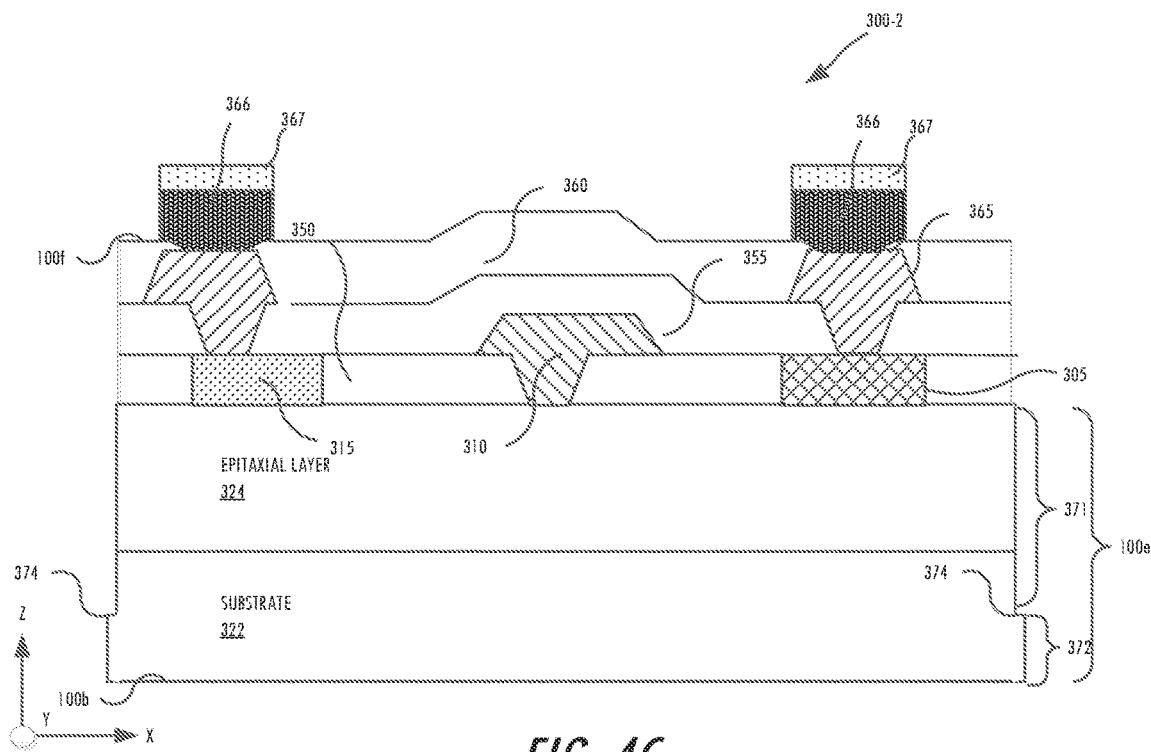

FIGS. 4A-4C are cross-sectional views illustrating methods of fabricating transistor structures including frontside pillar structures and trenches for die singulation according to some embodiments of the present disclosure. In particular, the operations of FIGS. 4A-4C illustrate a process sequence for forming devices 100 including transistor cells 300 without conductive through substrate via connections to the back side of the devices, using front side patterning to selectively reduce the thickness of the substrate 322 in particular areas for die singulation.

Referring now to FIG. 4A, after exposing the metal contacts 365 for off-chip connections in FIG. 2, frontside trenches (or 'streets') 373 are selectively formed in areas of the front side 100f of the device 100. The trenches 373 extend through the epitaxial layer 324 and partially into the substrate 322, such that the portions of the substrate 322 including the trenches 373 therein have a reduced thickness (as defined between the bottom surfaces or 'floors' of the trenches 373 and the back side of the substrate 322). The reduced thickness of the substrate 322 may be sufficient to provide stability during pillar formation while allowing for subsequent singulation. For example, the substrate 322 may have a thickness of about 500 μm to 1000 μm, while the trenches 373 may extend into the substrate 322 to provide a remaining thickness of between about 40 μm to 200 μm, for example, a thickness of between about 60 μm to 150 μm, at the floors of the trenches 373. The trenches 373 may be formed by a selective patterning process, for example, by forming one or more mask patterns on the exposed metal contacts 365 on the front side 100f of the device 100 and performing one or more selectively etching processes to remove portions of the epitaxial layer 324 (and corresponding portions of the underlying substrate 322) exposed by the mask pattern(s). The mask pattern(s) may be subsequently removed.

As shown in FIG. 4B, after forming the trenches 373 in the front side 100f of the device 100, respective conductive frontside pillars 366 and solder layers 367 are formed on the metal contacts 365 on the front side 100f, in a manner similar or identical to that described above with reference to FIG. 3A. By forming the frontside pillars 366 after the formation of the trenches 373, damage to the frontside pillars 366 during the trench formation and/or mask removal operations may be avoided.

As shown in FIG. 4C, the die 100 is singulated from a wafer including a plurality of dies at the portions of the substrate 322 having a reduced thickness defined by the trenches 373. For example, due to the reduced thickness of the substrate 322 between the floors of the trenches 373 and the back side of the substrate 322, a dicing or sawing process may be utilized to separate the die 100 from the wafer without performing a backgrinding process to thin the substrate 322. After singulation, the sidewalls or edges 100e of the die 100 may include first portions 371 adjacent the front side 100f (e.g., portions of the substrate 322 that defined sidewalls of the trenches 373) having surface characteristics (e.g., inclination angle and/or surface roughness) that differ from second portions 372 adjacent the back side 100b (e.g., portions of the substrate 322 subjected to the dicing, sawing, or other singulation process). For example, the first portions 371 of the sidewalls or edges 100e formed by the selective etching process may have different slope and/or different surface roughness than the second portions 372 formed by the dicing or sawing process. The width of the dicing saw may be narrower than the width of the trench 373, thereby defining a protruding lip 374 between the first and second portions 371 and 372 at the edges 100e of the substrate 322. As such, even when formed on a wafer or substrate 322 comprising materials having a high hardness (such as SiC), the device 100 may be singulated without performing the substrate thinning operations. The resulting transistor structures 300-2 thereby include a substrate 322 with increased thickness (relative to the substrate 322' of transistor structure 300-1), which may increase robustness, for example, in subsequent processing. In some embodiments, the singulated die 100 may include a substrate 322 having a thickness of about 50 to about 200 μm, for example, about 75 to about 175 μm, or about 100 to about 150 μm. In some embodiments, the singulated die 100 may include a substrate 322 having a thickness of greater than about 200 μm, for example, about 200 to 500 μm, or about 500 to about 800 μm.

Figure 9A:
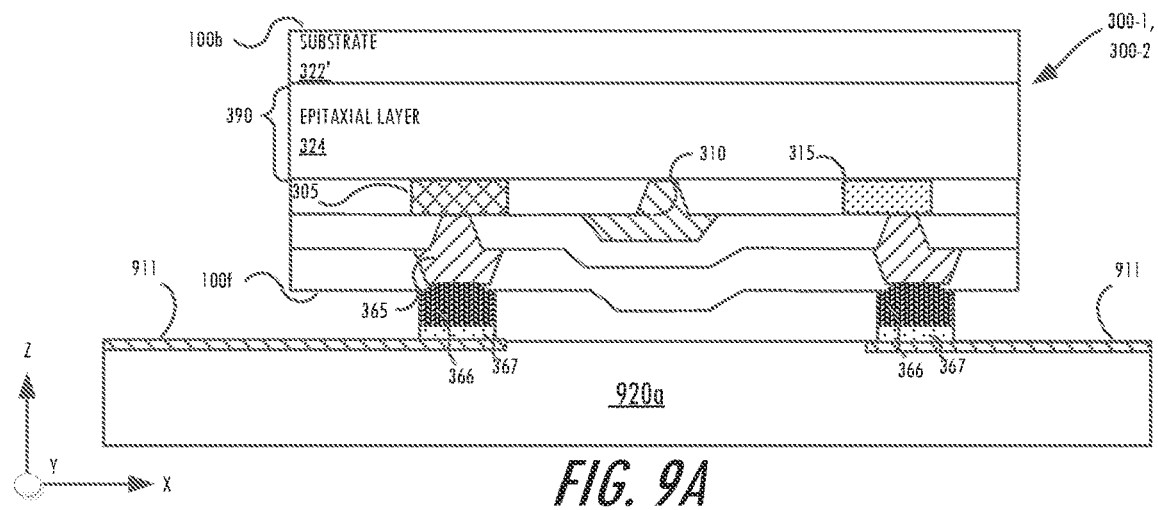
FIGS. 9A, 9B, and 9C are cross-sectional views illustrating examples of substrate attachment of RF transistor amplifier dies including transistor structures with frontside pillar structures according to some embodiments of the present disclosure.

In the embodiments of FIGS. 3A-3D and 4A-4C, transistor structures 300-1 and 300-2 are free of conductive through substrate via connections to the gate 310, source 315, or drain 305 contacts. Rather, as shown in FIG. 9A, the conductive connections/frontside pillars 366 may be used to provide off-chip electrical connections, for example, by 'flipping' the die 100 onto a substrate 920a (for example, a printed PCB or RDL structure) such that the frontside pillars 366 are physically attached and electrically connected to corresponding conductive traces 911, e.g., by the solder layers 367, for electrical signal routing. An RDL structure refers to a substrate or laminate that has conductive layer patterns and/or conductive via structures. RDL structures may be fabricated using semiconductor processing techniques, e.g., by depositing conductive and insulating layers and/or patterns on a base material and by forming vias and copper routing patterns within the structure for transmitting signals through the RDL structure. The need and/or use of wire bonds (which may introduce series inductance that can reduce or negate the effectiveness of impedance matching networks and/or harmonic termination circuits, particularly at the higher frequencies of RF applications) may thereby be reduced or eliminated in some embodiments.

Further embodiments described herein are directed to devices and fabrication methods that provide conductive through substrate via connections (or 'conductive vias') to the gate 310, source 315, and/or drain 305 contacts. For example, some embodiments may include backside vias that are configured to connect the source contact 315 to an electrical ground, and may further include a backmetal layer to provide a backside ground plane. While manufacturability may be limited by the amount of wafer handling after backside thinning and/or by the geometry of the frontside pillar structures, further embodiments described herein may address these and/or other limitations.

FIGS. 5A-5F are cross-sectional views illustrating methods of fabricating transistor structures including frontside pillar structures and conductive through substrate via connections to the back side of the devices according to some embodiments of the present disclosure. In particular, the operations of FIGS. 5A-5F illustrate a process sequence for forming devices 100 including transistor cells 300 using as few as one wafer carrier bonding step or process, as the wafer bonding operations may be limited by the geometry of the frontside pillars.

Figure 5A:
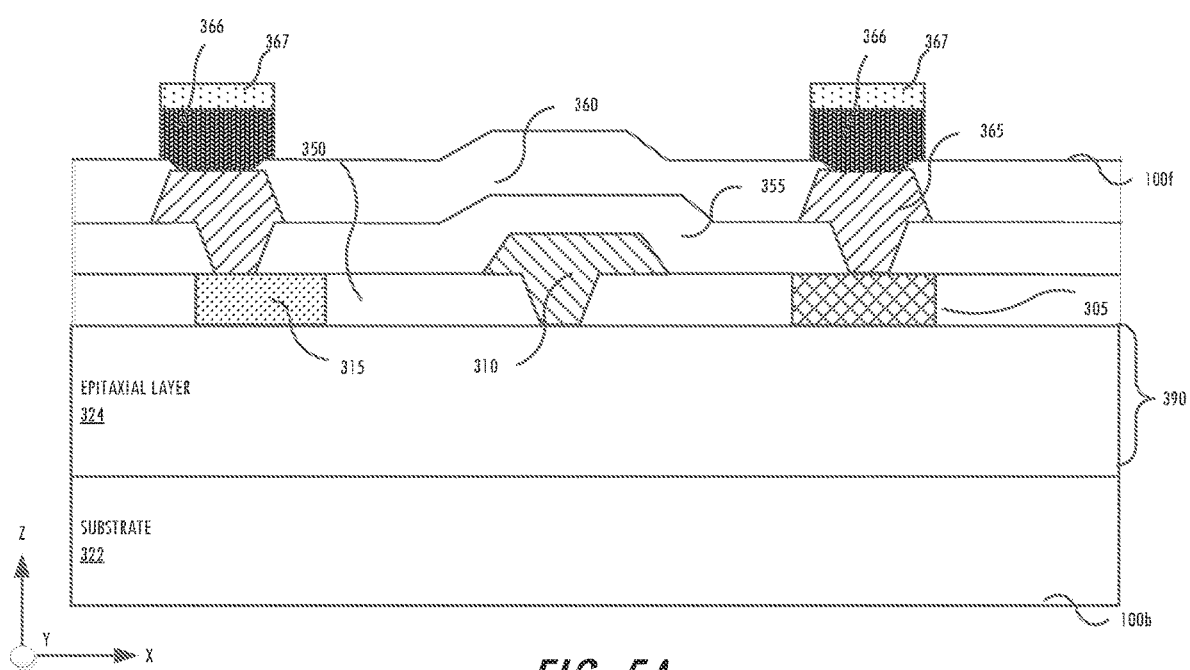
FIGS. 5A, 5B, 5C, 5D 5E, and 5F are cross-sectional views illustrating methods of fabricating transistor structures including frontside pillar structures and conductive vias using wafer carrier bonding according to some embodiments of the present disclosure.
Figure 5B:
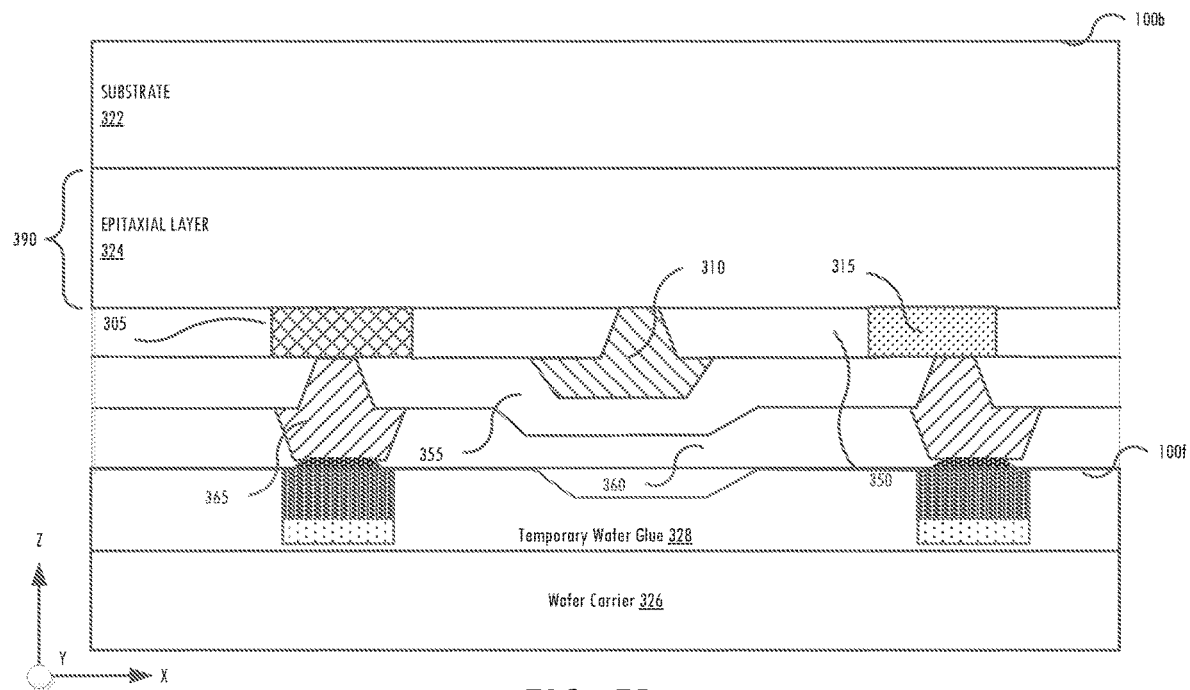
Figure 5C:
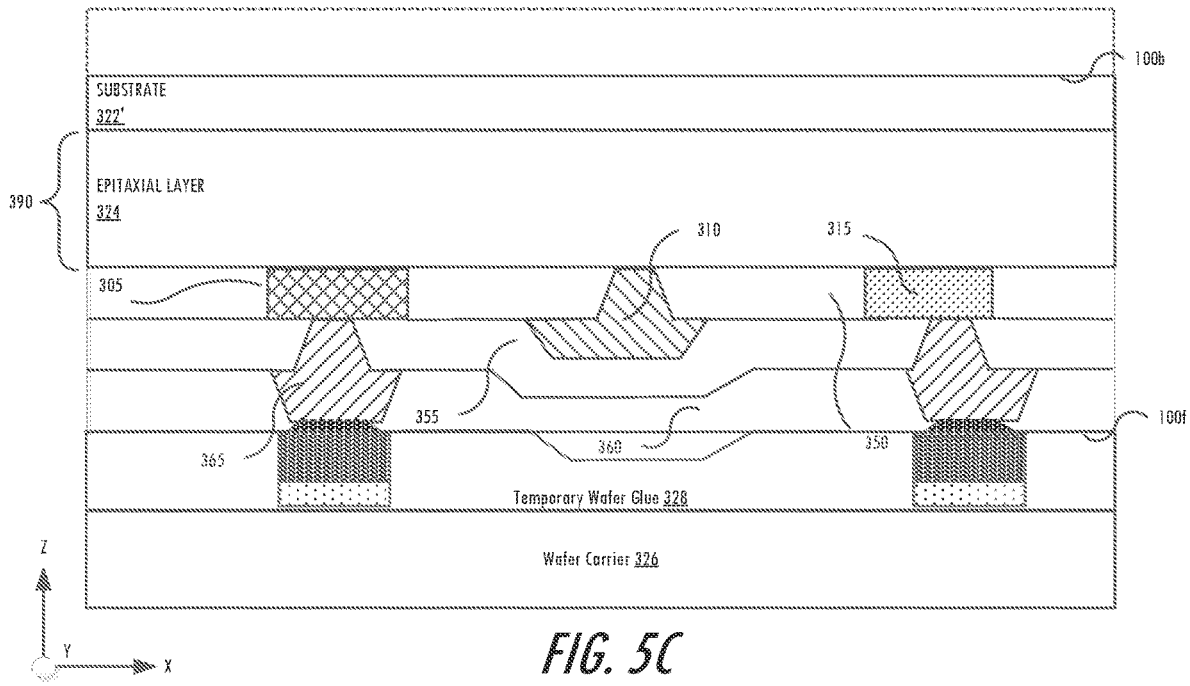

Referring now to FIG. 5A, after exposing the metal contacts 365 for off-chip connections in FIG. 2, respective conductive frontside pillars 366 and solder layers 367 are formed on the metal contacts 365 on the front side 100f of the die 100, in a manner similar or identical to that described above with reference to FIG. 3A. As shown in FIG. 5B, the front side 100f of the device 100 including the frontside pillars 366 protruding therefrom is 'flipped' and attached (front side down) to a wafer carrier 326, for example, by temporary wafer glue 328, in a manner similar or identical to that described above with reference to FIG. 3B. In FIG. 5C, a thickness of the substrate 322 is reduced (e.g., by a uniform backside grinding process) for purposes of both singulation and via formation, in a manner similar or identical to that described above with reference to FIG. 3C. The wafer carrier 326 (and/or the attachment thereto by the temporary glue 328) supports and protects the frontside pillars 366 of the device 100 from stresses induced by the thinning of the substrate 322. The substrate 322' thereby has a reduced but substantially uniform thickness due to the backside grinding or other thinning process.

Figure 5D:
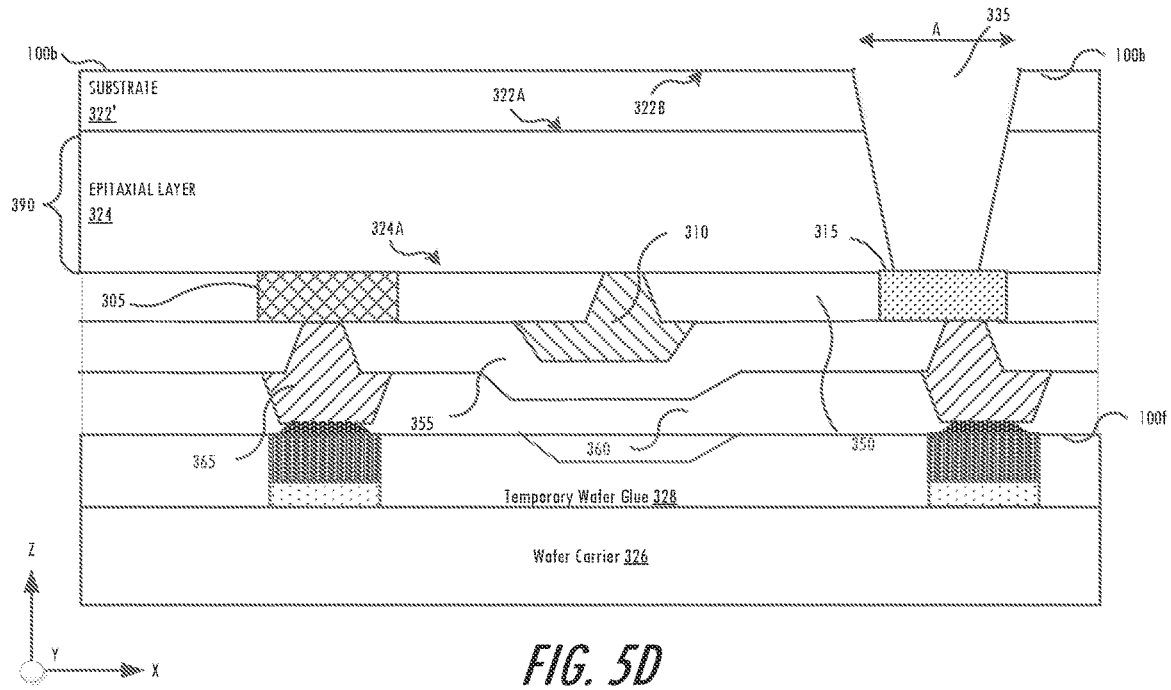

As shown in FIG. 5D, a via opening 335 is formed through the substrate 322' and the epitaxial layer 324 to expose a portion of one of the contacts 305, 310, 315 (illustrated with reference to the source contact 315). In particular, the via opening 335 extends from the back side 100b of the die 100 (defined by a back surface 322B of the substrate 322'), and through the substrate 322' and the epitaxial layer 324 to the surface 324A of the epitaxial layer 324, such that an underside or lower surface of the source contact 315 is exposed by the via opening 335. The via opening 335 may have an elliptical or polygonal shape in plan view. In some embodiments, sidewalls of the via opening 335 may be inclined and/or slanted with respect to the back surface 322B of the substrate 322'. For example, a dimension (e.g., diameter or area) "A" of the via opening 335 may be greater at the opening in the back surface 322B of the substrate 322' than adjacent the source contact 315.

The via opening 335 may be formed by masking and etching techniques as understood by those of skill in the art. For example, the via opening 335 may be formed by wet or dry etching. In some embodiments, the source contact 315 may serve as an etch stop material during the formation of the via opening 335. In some embodiments, the via opening 335 may be etched such that sidewalls of the via opening 335 may be inclined or slanted with respect to the back surface 322B of the substrate 322'. In some embodiments, the etch process may be based on an anisotropic etch platform or processing conditions, with the etch chemistry and/or other process parameters adjusted such that the sidewalls of the via opening 335 have an inclined or slanted shape. That is, the etch process used to define the via opening 335 may include a combination of anisotropic and isotropic etching aspects to achieve a desired sidewall slope that allows for sufficient metal coverage on the sidewalls of the trench or opening 335. Due to the etching, a largest dimension A of the via opening 335 may be adjacent the back surface 322B of the substrate 322'. The dimension A of the via opening 335 may also be related to a thickness of the substrate 322', as etching of thicker substrates 322 may result in wider via openings 335. Reducing the thickness of the substrate 322' may thus form the via opening 335 with a smaller dimension A, which may reduce the overall size of the device 100 and reduce inductance. That is, the operations for thinning the substrate 322' may provide additional advantages with respect to via formation.

Figure 5E:
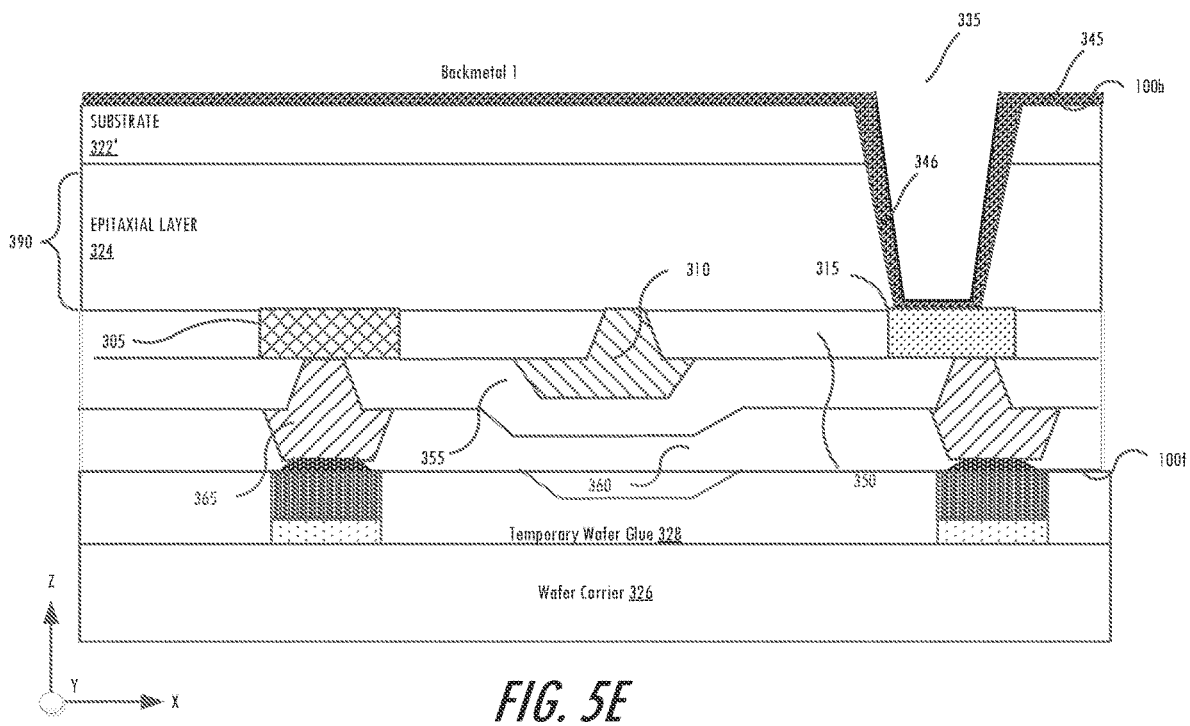

As shown in FIG. 5E, a metal layer 345 is deposited or otherwise formed on the back surface 322B of the substrate 322', and also on side walls and a bottom surface of the via opening 335 to define a conductive through substrate via connection or backside via 346. The backmetal layer 345 and the backside via 346 may include conductive layer(s) that contact the source contact 315 to couple electrical signals thereto. For example, the backmetal layer 345 may include a conductive metal such as titanium, platinum, and/or gold. In the example of FIGS. 5A-5F, the backmetal layer 345 may be configured to couple the source contact 315 to an electrical ground. More generally, the backmetal layer 345, and a reference signal coupled thereto, may be electrically connected to one of the device contacts 305, 310, 315 by the conductive via 346 extending through the via opening 335.

Figure 5F:
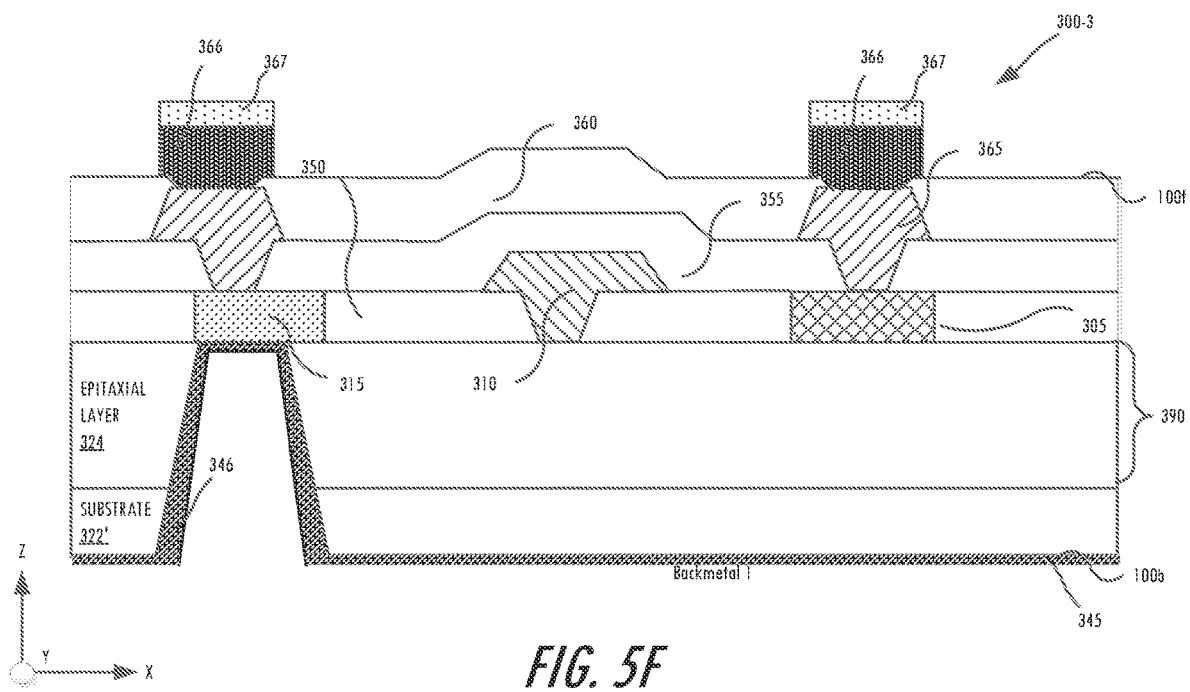

As shown in FIG. 5F, after the formation of the backmetal layer 345, the device 100 including transistor structures 300-3 is de-mounted or otherwise detached from the wafer carrier 326 and is ready for singulation and mounting (e.g., in a package as illustrated in FIGS. 10-12) in subsequent processes. As such, the frontside pillars 366 may provide connections to one or more terminals (e.g. input, output, ground) on the front side 100f of the device 100, and the backmetal layer 345/backside via 346 may provide connections to another of the terminals (e.g. input, output, ground) on the back side 100b of the device 100.

Figure 9B:
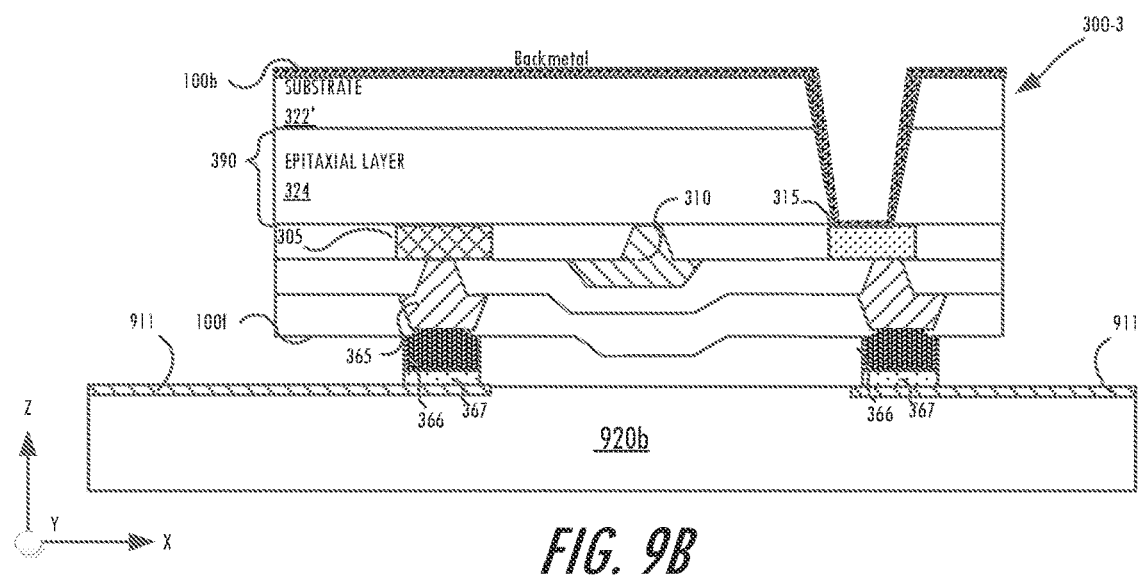
Figure 9C:
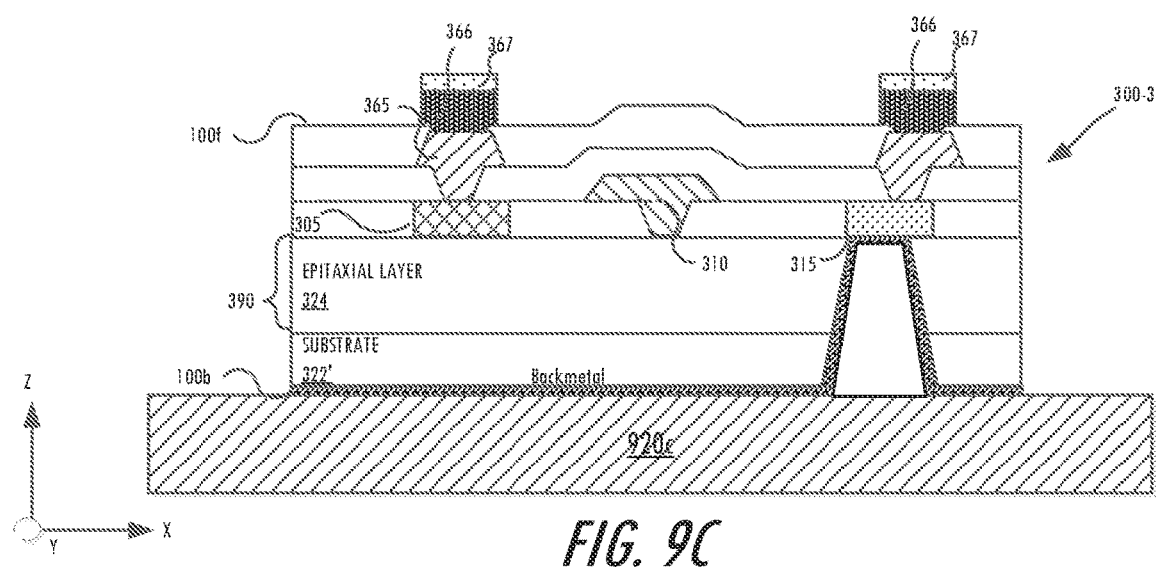

In some embodiments, as shown in FIG. 9B, the die 100 including transistor structures 300-3 of FIG. 5F may be flipped onto a package substrate 920b (e.g., a PCB or RDL structure) such that the frontside pillars 366 are physically attached and electrically connected to corresponding conductive traces 911 provided by the substrate 920b, for electrical signal routing through the substrate. In other embodiments, as shown in FIG. 9C, the die 100 including transistor structures 300-3 may be mounted on a package substrate 920c (e.g., a conductive flange of a thermally-enhanced package) such that the backmetal layer 345 is physically attached and electrically connected to a thermally conductive heat sink provided by the substrate 920c, for both electrical signal routing (e.g., coupling to an electrical ground) and heat transfer through the substrate. For example, because a SiC substrate 322' may be a good thermal conductor, the die 100 can be mounted on the heat sink (which may be implemented as a conductive flange 920c as shown, or as a PCB or RDL structure including a heat sink) with the back side down. With the orientation shown in FIG. 9C, one or more additional dies or passive components (such as IPDs) may be electrically connected to the pillars 366 opposite to the substrate 920c, for example, in a stacked configuration. In some embodiments, the die(s) and/or passive component(s) may be used to electrically connect one or more of the pillars 366 (e.g., the drain-connected pillar 366) to a package lead, as described for example in commonly-owned U.S. Provisional Patent Application No. 63/004,760, filed Apr. 3, 2020, the disclosure of which is incorporated by reference herein.

Figure 6A:
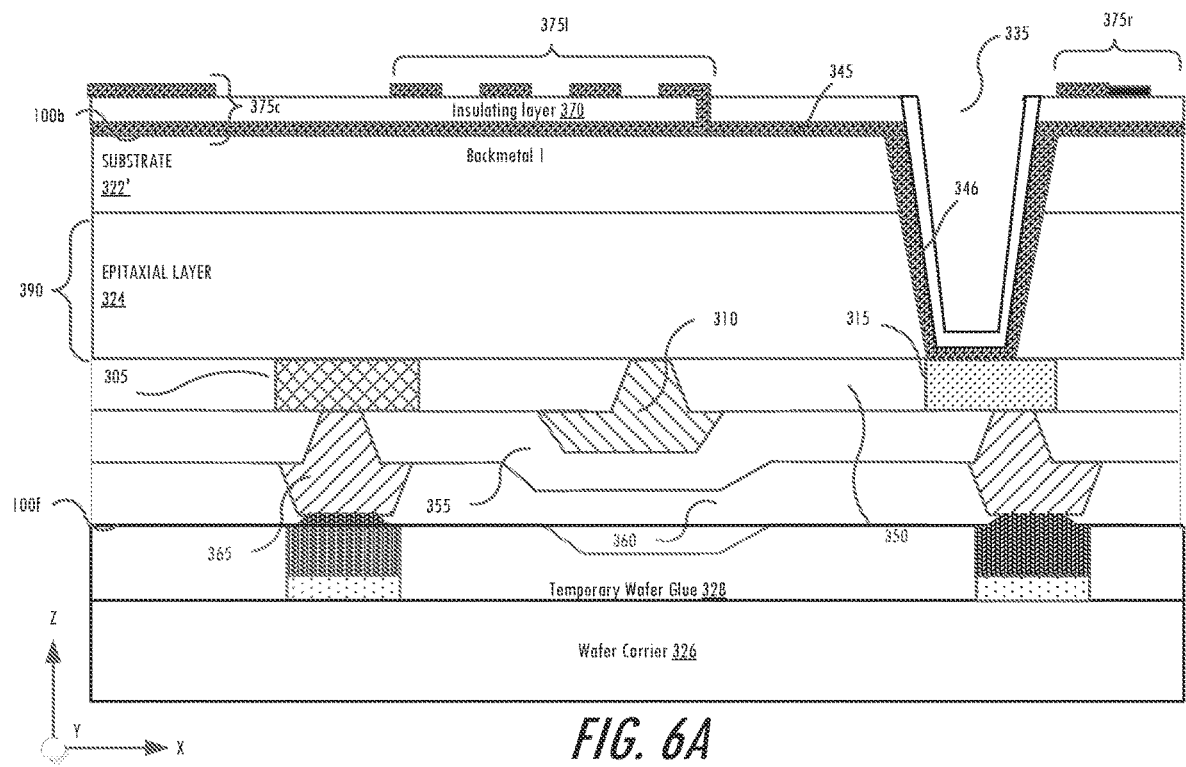
FIGS. 6A and 6B are cross-sectional views illustrating methods of fabricating transistor structures including frontside pillar structures and passive devices on a back side of the die according to some embodiments of the present disclosure.
Figure 6B:
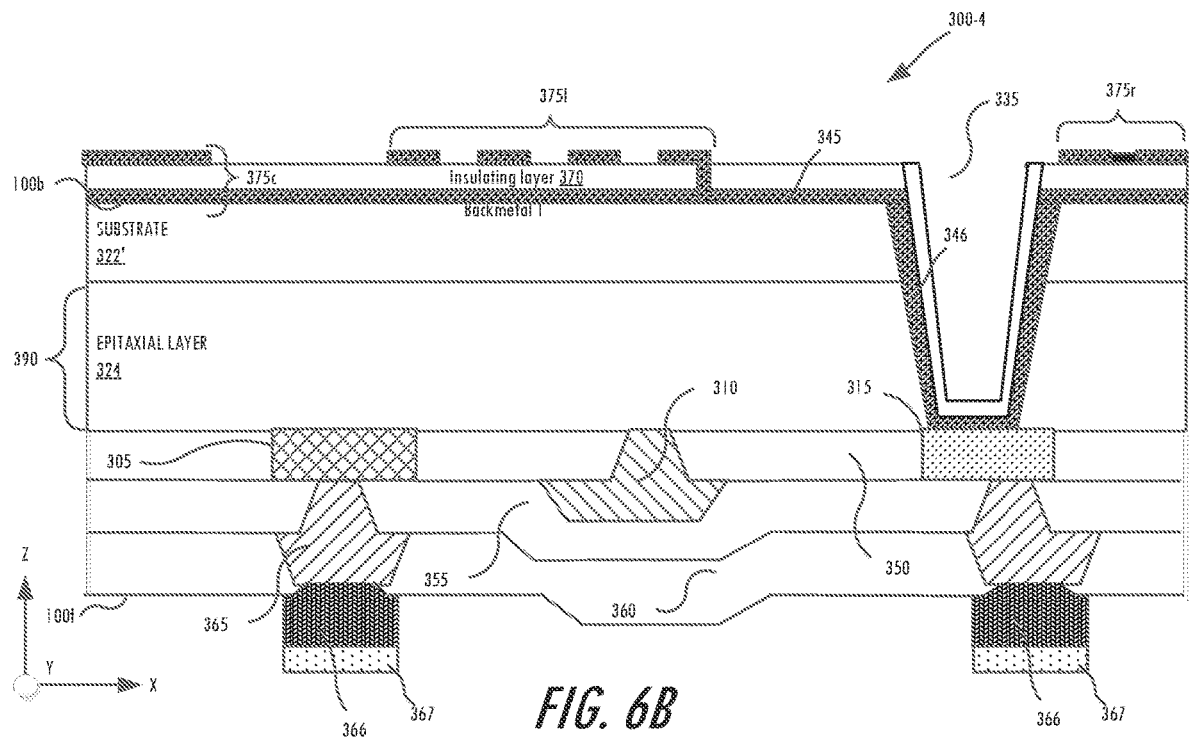

FIGS. 6A and 6B are cross-sectional views illustrating methods of fabricating transistor structures including frontside pillar structures and passive devices on a back side of the die 100 according to some embodiments of the present disclosure. In particular, the formation of the backmetal layer 345 may be used to increase device integration by providing passive devices 375 (i.e., resistive components such as resistors 375r and/or reactive components such as capacitors 375c and/or inductors 375l) on the backmetal layer 345 on the back side 100b of the device 100. The passive devices 375 may be discrete components used to implement one or more functional blocks, such as impedance matching circuits, harmonic filters, couplers, baluns, and power combiners/dividers, on the back side 100b of the device 100. For example, the discrete components 375 may define at least a portion of an input or output impedance matching circuit and/or a harmonic termination circuit for a RF power amplifier. In some embodiments, implementing impedance matching circuits and/or harmonic termination circuits on the back side 100b of the device 100 may reduce or eliminate complexities associated with off-chip connections (e.g., using wire bonds) to such matching circuitry. The passive circuitry 375 can be connected to the active transistor cells 300 adjacent the front side 100f of the device 100 by backside vias 346 in some embodiments. However, it will be understood that the backside vias 346 and/or frontside pillars 366 may not be present in some embodiments.

In some embodiments, the passive devices 375 may include Integrated Passive Devices (IPDs). IPDs include passive electrical components, and may be fabricated using standard semiconductor processing techniques such as thin film and/or photolithography processing. IPDs can be flip chip mountable or wire bondable components, and may include thin film substrates such as silicon, alumina, or glass.

Referring now to FIG. 6A, after forming a first backmetal layer 345 in FIG. 5E, an insulator layer 370 is formed on the first backmetal layer 345 on the back side 100b of the device 100 and on the backside via 346 in the via opening 335. The insulator layer 370 may include one or more dielectric materials, such as silicon nitride ($Si_xN_y$), aluminum nitride (AlN), silicon dioxide ($SiO_2$). The passive devices 375 are formed on the insulator layer 370, for example, by forming and patterning a second backmetal layer to define one or more discrete capacitors 375c (e.g., defined by patterned portions of the second backmetal layer, the first backmetal layer 345, and the portions of the insulator layer 370 therebetween), one or more discrete inductors 375l (e.g., defined by portions of the second backmetal layer patterned to define conductive traces/coils), and/or one or more discrete resistors 375r (e.g., defined by portions of the second backmetal layer patterned to define resistive segments). The insulator layer 370 and the passive devices 375 are formed while the substrate 322' and epitaxial layer 324 are mounted to the wafer carrier 326 (e.g., by the temporary glue 328), so as to protect the conductive pillars 366 on the front side 100f of the device 100 from stress.

As shown in FIG. 6B, after the formation of the passive devices 375, the device 100 including transistor structures 300-4 is de-mounted or otherwise detached from the wafer carrier 326 and is ready for singulation and mounting (e.g., in a package as illustrated in FIGS. 10-12) in subsequent processes. As such, the frontside pillars 366 may provide connections to one or more terminals (e.g. input, output, ground) on the front side 100f of the device 100, and the passive circuitry on the backmetal layer 345 may implement matching circuitry (e.g., input/output impedance matching circuits or harmonic termination circuits) between one or more of the terminals of the device 100 and an external device or ground connection on the back side 100b of the device 100.

In some embodiments, the device 100 including transistor structures 300-4 of FIG. 6B can be connected to a substrate (e.g., a printed circuit board (PCB) or redistribution layer (RDL) structure) by the frontside pillars 366, in a manner similar or identical to that described with reference to FIG. 9B. That is, the die 100 may be flipped onto a package substrate such that the frontside pillars 366 are physically attached and electrically connected to corresponding conductive traces provided by the substrate, for electrical signal routing through the substrate. In other embodiments, the device 100 including transistor structures 300-4 can be connected to a substrate back side-down, in a manner similar to identical to that described with reference to FIG. 9C, with one or more additional metal layers and/or protective dielectric layers provided between the back side 100b and the substrate to protect and isolate the passive devices 375.

FIGS. 7A-7G are cross-sectional views illustrating methods of fabricating transistor structures including frontside pillar structures with conductive through via structures using multiple-wafer carrier bonding according to some embodiments of the present disclosure. In particular, the operations of FIGS. 7A-7G illustrate a process sequence for forming devices 100 including transistor cells 300 using multiple wafer carrier bonding steps or processes to avoid attachment of the wafer carrier while the frontside pillars are present, which may allow for more frontside pillars with more aggressive geometries, for example, a two- to five-times increase in the aspect ratio (height to width) of the frontside pillars as compared to some single wafer carrier bonding implementations.

Figure 7A:
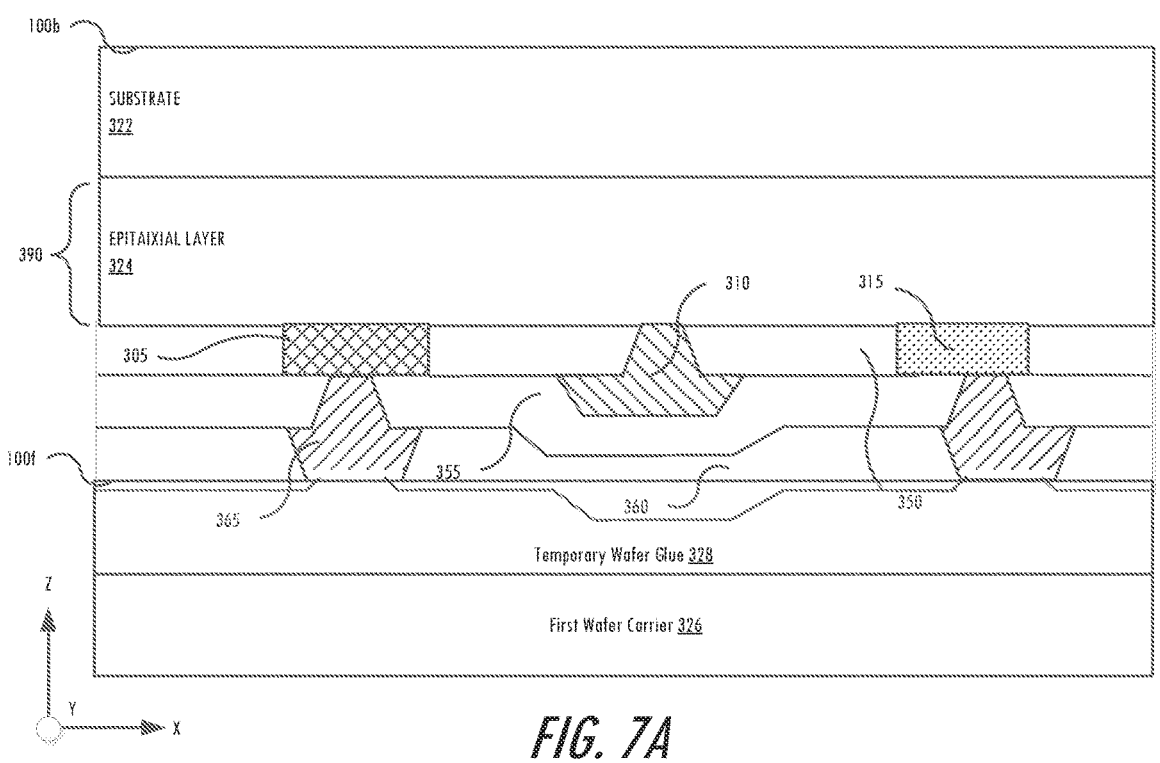
FIGS. 7A, 7B, 7C, 7D, 7E, 7F, and 7G are cross-sectional views illustrating methods of fabricating transistor structures including frontside pillar structures and conductive vias using multiple wafer carrier bonding according to some embodiments of the present disclosure.
Figure 7B:
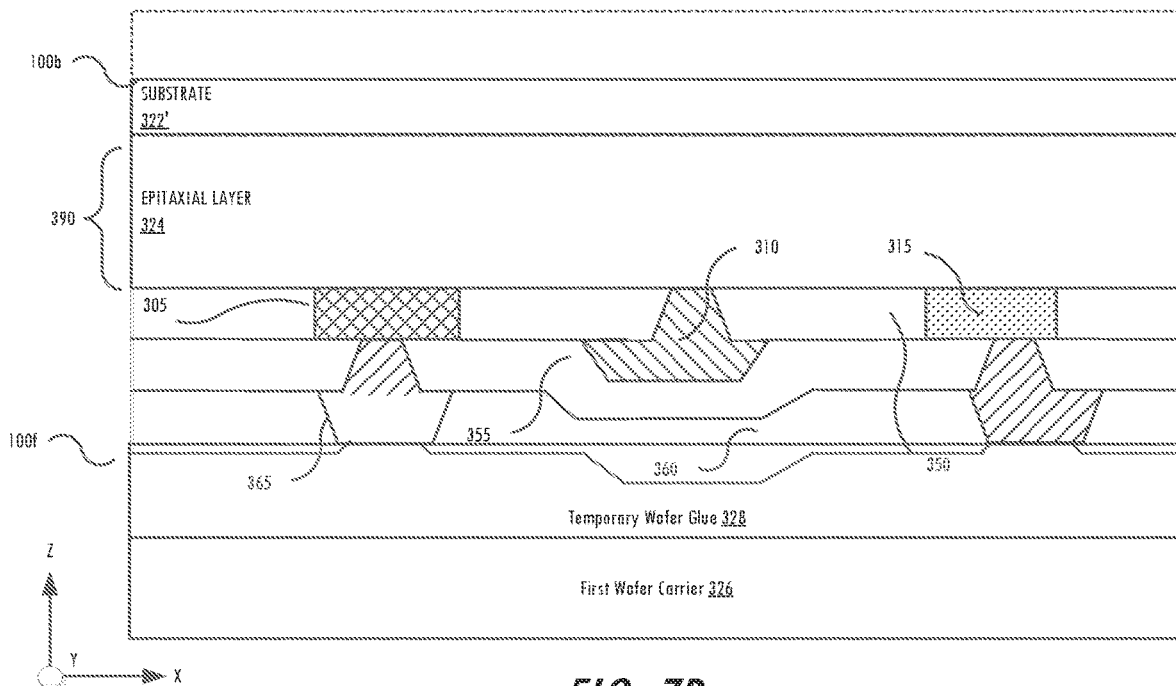

Referring now to FIG. 7A, after exposing the metal contacts 365 for off-chip connections in FIG. 2, the device 100 is 'flipped' and attached (front side down) to a first wafer carrier 326, for example, by temporary wafer glue 328. In FIG. 7B, a thickness of the substrate 322 is reduced (e.g., by a uniform backside grinding process) for purposes of both singulation and via formation, in a manner similar or identical to that described above with reference to FIG. 3C. The substrate 322' thereby has a reduced but substantially uniform thickness due to the backside grinding or other thinning process.

Figure 7C:
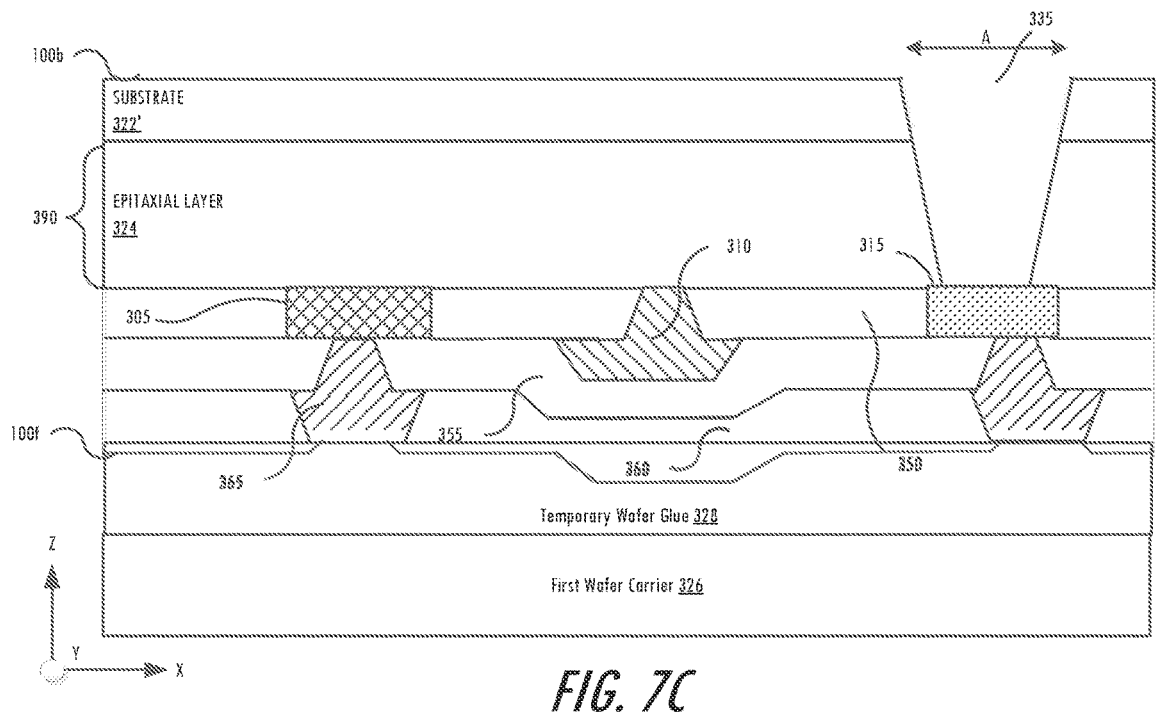
Figure 7D:
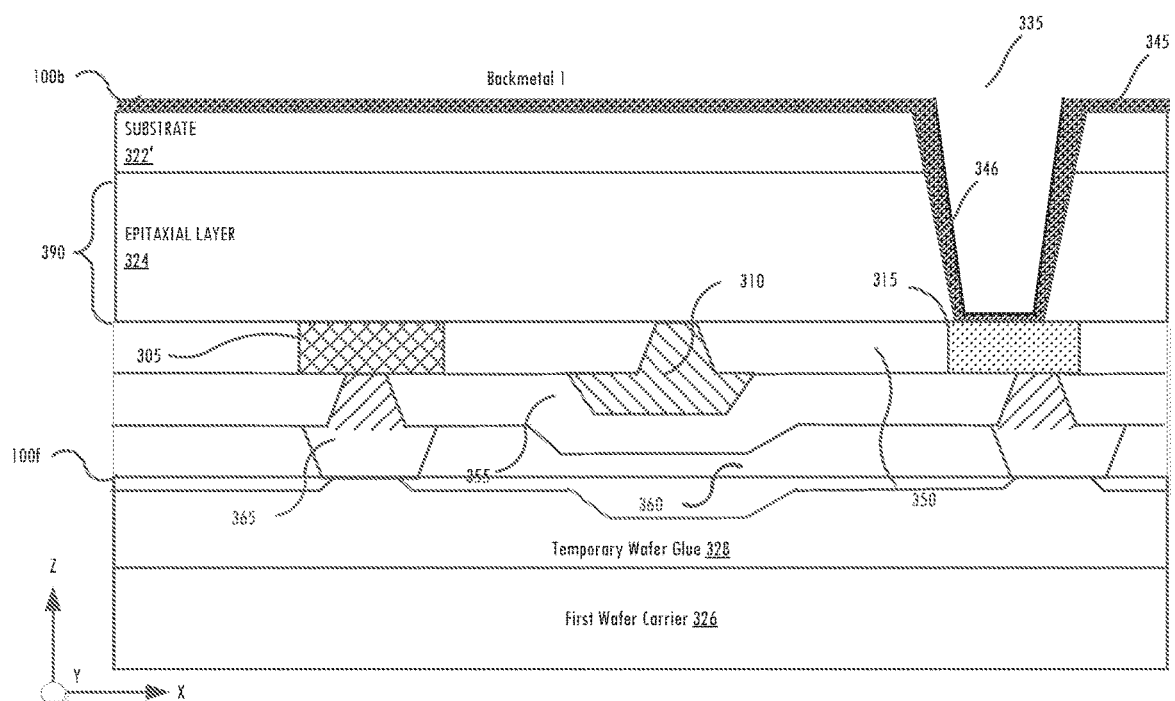

As shown in FIG. 7C, with the device 100 still attached to the first wafer carrier 326, via opening 335 is formed through the substrate 322' and the epitaxial layer 324 to expose a portion of one of the contacts 305, 310, 315 (illustrated with reference to the source contact 315), in a manner similar or identical to that described above with reference to FIG. 5D. In FIG. 7D, a backmetal layer 345 is deposited or otherwise formed on the back surface 322B of the substrate 322, and also on side walls and a bottom surface of the via opening 335 to define a backside via 346, in a manner similar or identical to that described above with reference to FIG. 5E.

Figure 7E:
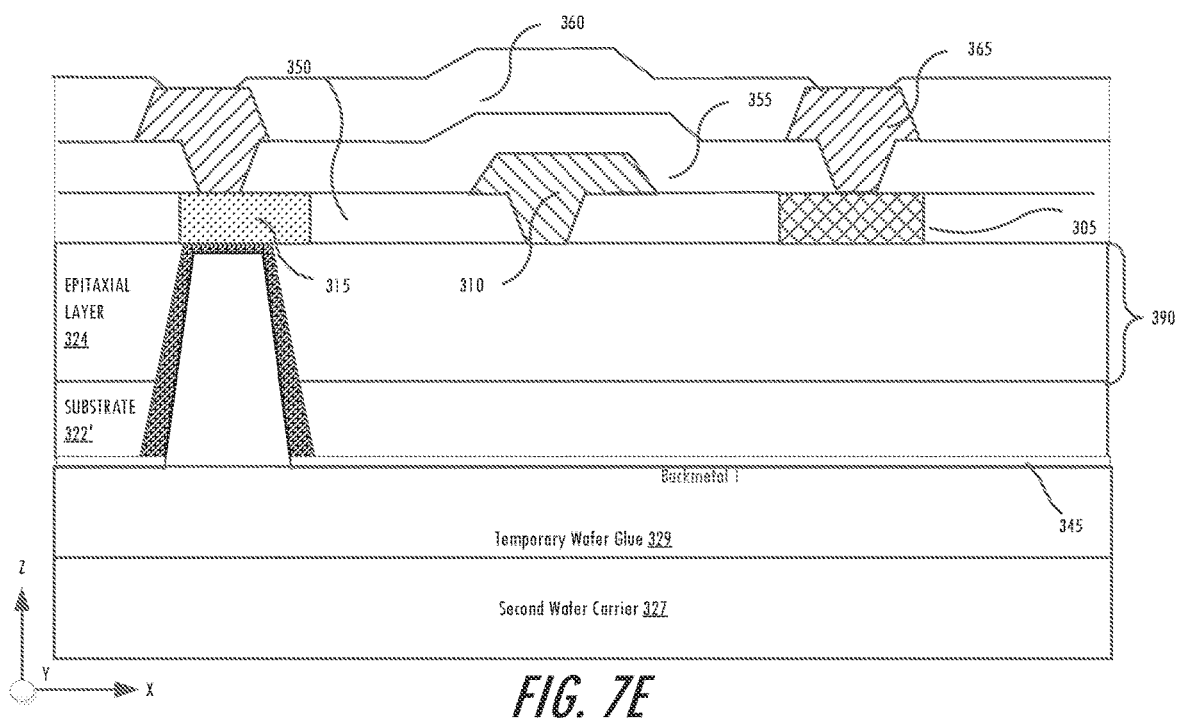
Figure 7F:
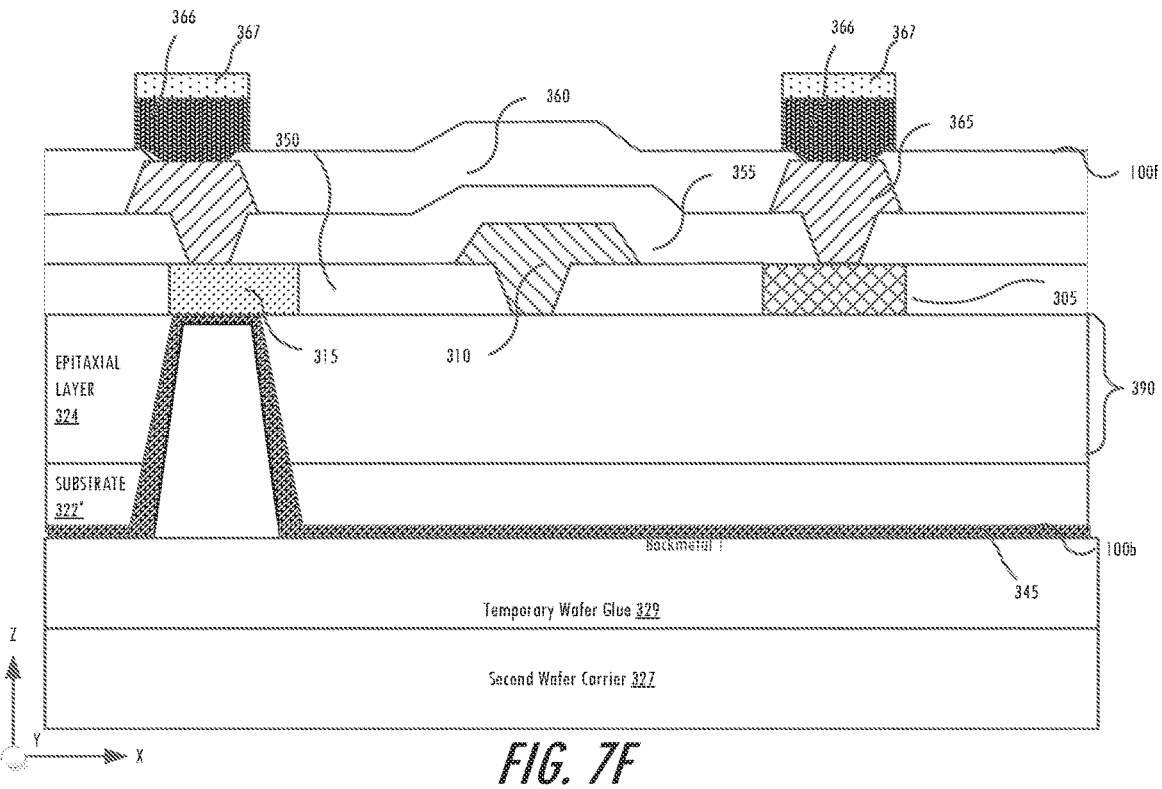
Figure 7G:
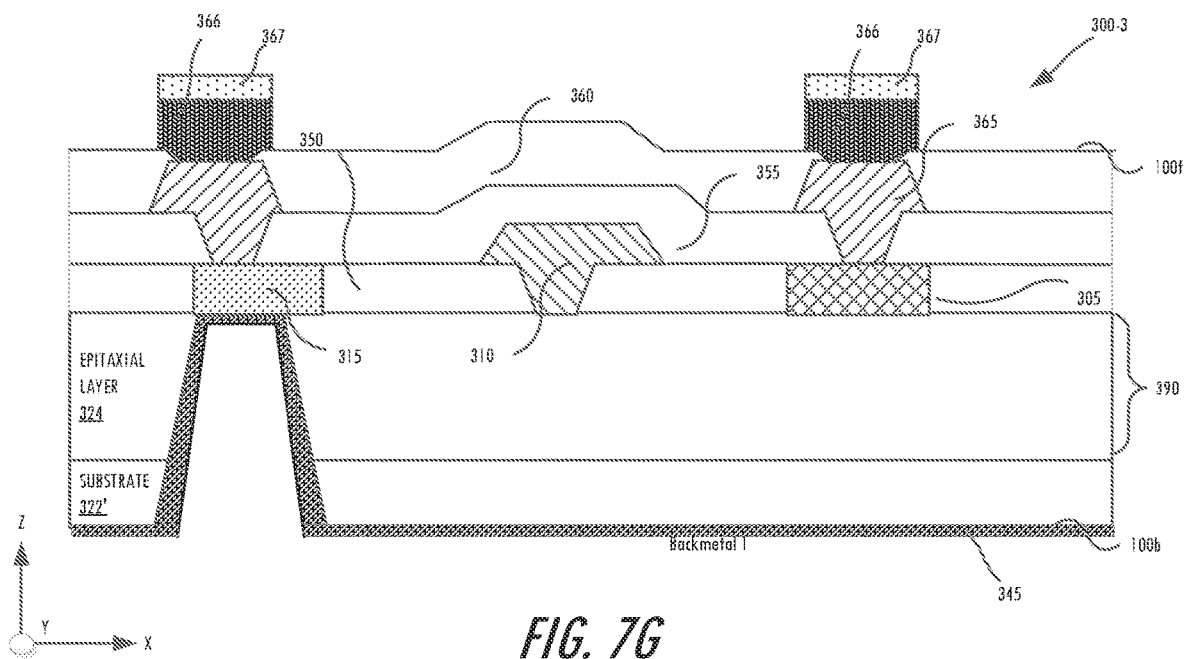

As shown in FIG. 7E, after forming the backmetal layer 345, the device 100 is again 'flipped' and attached (back side down) to a second wafer carrier 327, for example, by temporary wafer glue 329. The device 100 is also de-mounted or otherwise detached from the wafer carrier 326. In FIG. 7F, respective conductive frontside pillars 366 and solder layers 367 are formed on the metal contacts 365 on the front side 100f, in a manner similar or identical to that described above with reference to FIG. 3A. As shown in FIG. 7G, after the formation conductive frontside pillars 366, the device 100 including transistor structures 300-3 is de-mounted or otherwise detached from the second wafer carrier 327 and is ready for singulation and mounting (e.g., in a package as illustrated in FIGS. 10-12) in subsequent processes, in a manner similar to or identical to that described above with reference to FIG. 5F.

FIGS. 8A-8D are cross-sectional views illustrating methods of fabricating transistor structures including frontside pillar structures and passive devices on a back side of the die according to some embodiments of the present disclosure, using multiple-wafer carrier bonding according to some embodiments of the present disclosure.

Figure 8A:
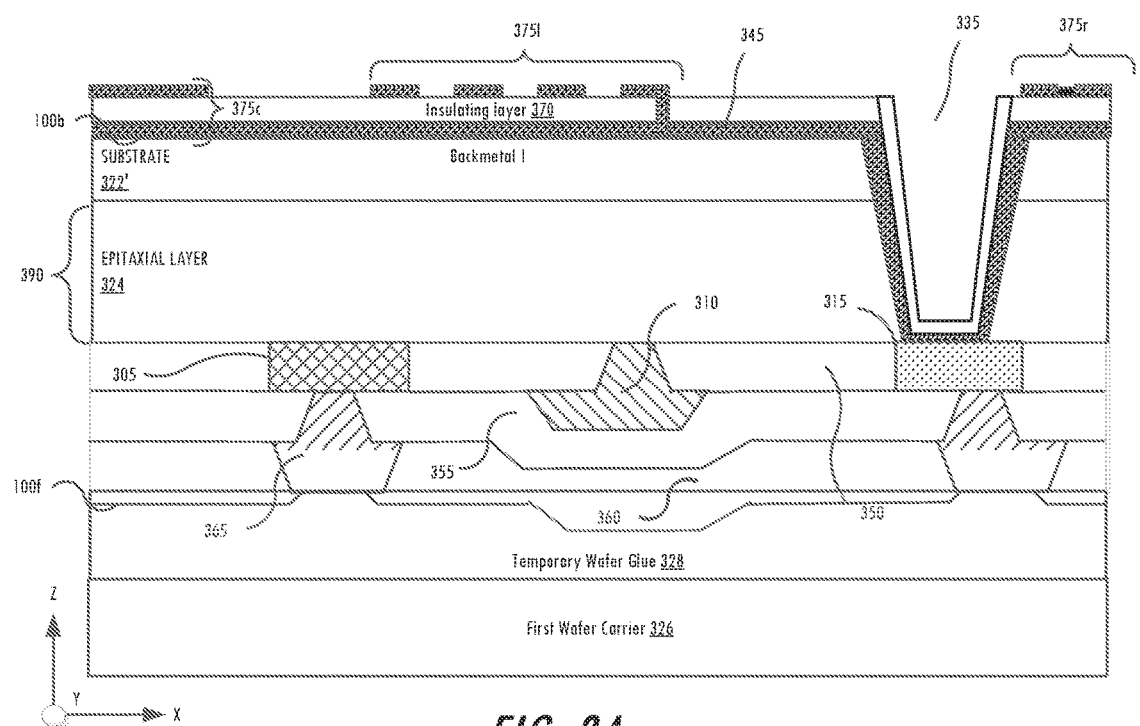
FIGS. 8A, 8B, 8C, and 8D are cross-sectional views illustrating methods of fabricating transistor structures including frontside pillar structures and passive devices on a back side of the die using multiple wafer carrier bonding according to some embodiments of the present disclosure.

Referring now to FIG. 8A, after forming the backmetal layer 345 in FIG. 7D, an insulator layer 370 is formed on the backmetal layer 345 on the back side 100b of the device 100 and on the backside via 346 in the via opening 335, and passive devices 375 (including one or more capacitors 375c, one or more inductors 375l, and/or one or more resistors 375r) are formed on the insulator layer 370, for example, in a manner similar or identical to that described above with reference to FIG. 6A. The insulator layer 370 and the passive devices 375 are formed while the substrate 322' and epitaxial layer 324 are mounted to the first wafer carrier 326 (e.g., by the temporary glue 328).

Figure 8B:
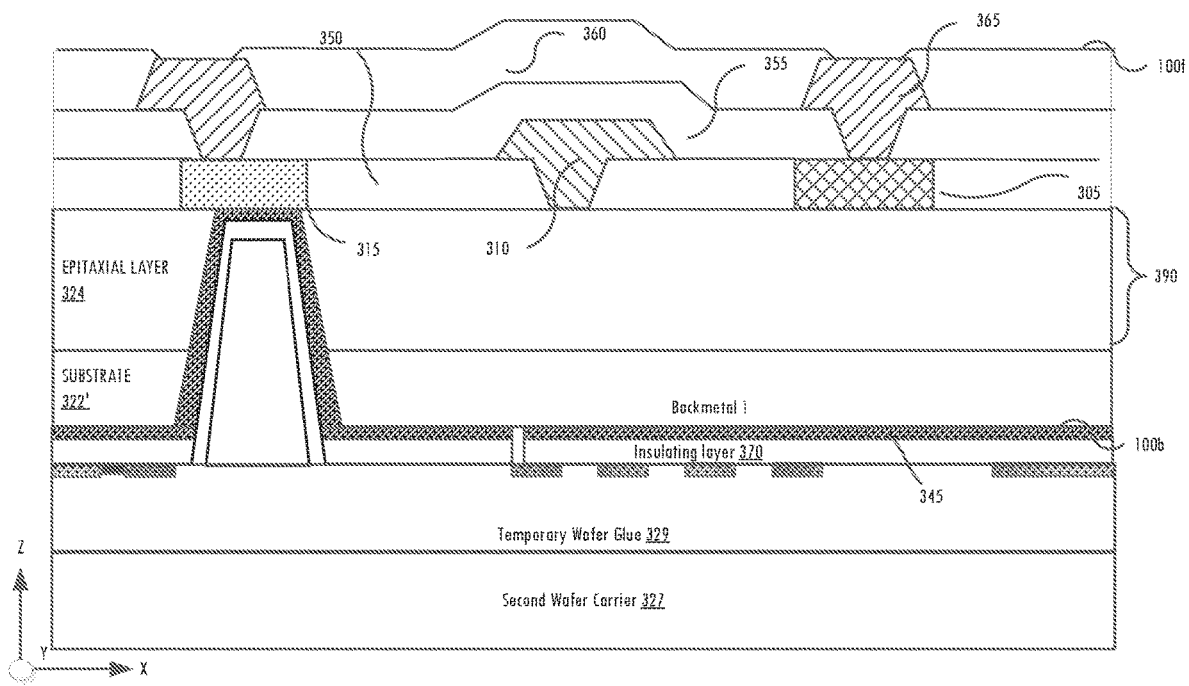
Figure 8C:
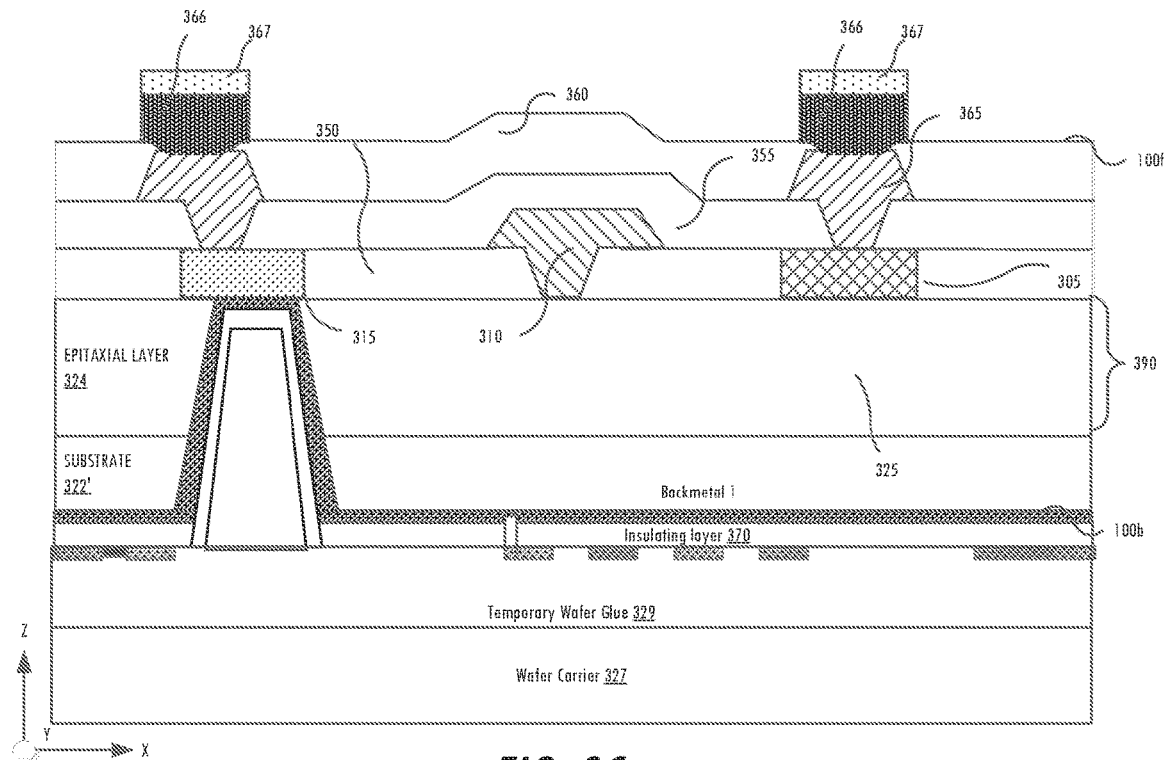
Figure 8D:
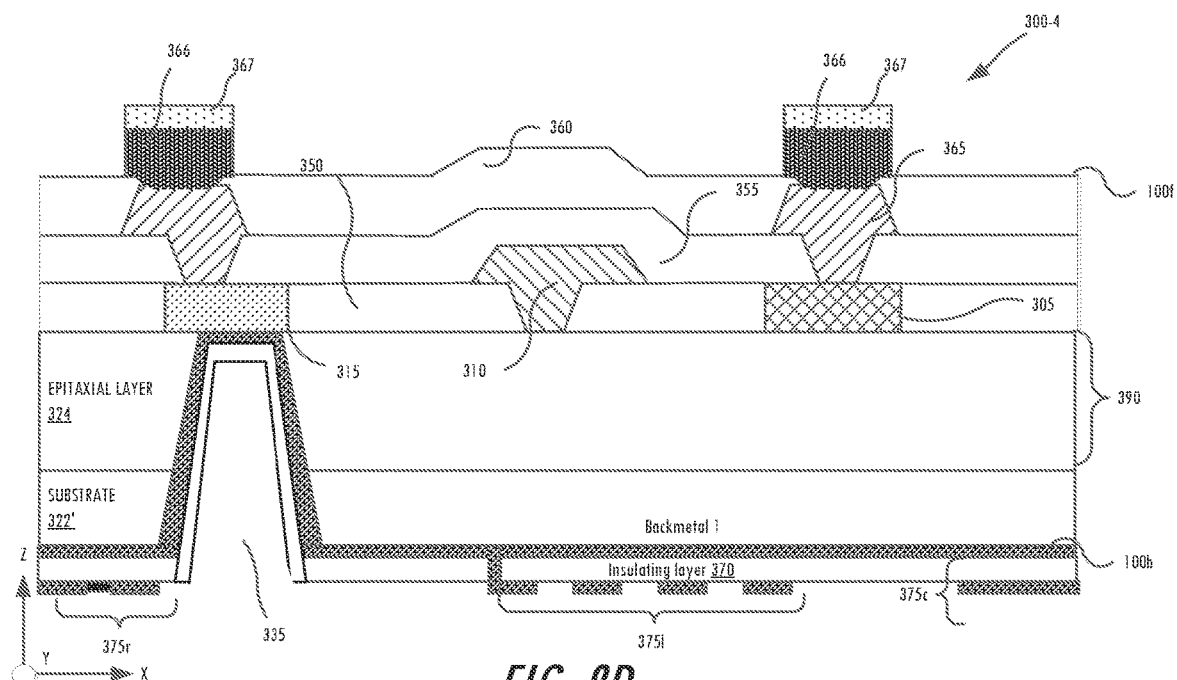

As shown in FIG. 8B, after forming the passive devices 375, the device 100 is again 'flipped' and attached (back side down) to a second wafer carrier 327 (e.g., by temporary wafer glue 329) and the device 100 is de-mounted or otherwise detached from the first wafer carrier 326, in a manner similar or identical to that described above with reference to FIG. 7E. In FIG. 8C, respective conductive frontside pillars 366 and solder layers 367 are formed on the metal contacts 365 on the front side 100f, in a manner similar or identical to that described above with reference to FIG. 7F. As shown in FIG. 8D, after the formation conductive frontside pillars 366, the device 100 is de-mounted or otherwise detached from the second wafer carrier 327, in a manner similar or identical to that described above with reference to FIG. 7G. The device 100 including transistor structures 300-4 is ready for singulation and mounting (e.g., in a package as illustrated in FIGS. 10-12) in subsequent processes, in a manner similar or identical to that described above with reference to FIG. 6B.

While described primarily with reference to HEMT transistor structures, it will be understood that fabrication processes and transistor structures in accordance embodiments of the present disclosure are not so limited. For example, the devices and fabrication methods described herein may be applied to other transistor structures, including but not limited to vertical or lateral MOSFET structures, with the gate contact 310 separated by from the surface of the epitaxial layer 324 by an oxide or other insulating layer. In a device having a lateral structure, the terminals of the device (e.g., the drain, gate and source terminals for a power MOSFET device) are on the same major surface (i.e., top or bottom) of a semiconductor layer structure. In contrast, in a device having a vertical structure, at least one terminal is provided on each major surface of the semiconductor layer structure (e.g., in a vertical MOSFET device, the source may be on the top surface of the semiconductor layer structure and the drain may be on the bottom surface of the semiconductor layer structure). Vertical power semiconductor devices that include a MOSFET transistor can have a standard gate electrode design in which the gate electrode of the transistor is formed on top of the semiconductor layer structure or, alternatively, may have the gate electrode buried in a trench within the semiconductor layer structure, typically referred to as gate trench MOSFETs.

FIG. 10 is a cross-sectional view illustrating an example of an over mold-type integrated circuit device package including an RF transistor amplifier die 100 in accordance with some embodiments of the present disclosure. As shown in FIG. 10, the package 1000 includes a device 100 having components and connections similar to any of the embodiments described herein (shown by way of example with reference to the transistor structures 300-4), which are flipped and mounted by the frontside pillars 366 and die attach material layers (e.g., solder layers 367) to respective conductive traces 1021 on a substrate 1020, such as a PCB or RDL structure. In the example of FIG. 10, an over mold-type packaging material 1013 substantially surrounds or encapsulates the device 100, while providing access to package leads (e.g., gate and drain leads) 1011i, 1011o (collectively 1011) via wire bond connections 1025 for connection to circuits or devices that are external to the package 1000. The over-mold 1013 may be formed of a plastic or a plastic polymer compound, thereby providing protection from the outside environment. Some advantages of the over mold type packaging material 1013 include reduced overall height or thickness of the package 1000, and design flexibility for the arrangement of and/or spacing between the leads 1011.

In particular, in the example of FIG. 10, an input lead 1011i is coupled to the gate 310 by a wirebond 1025, one or more of the passive devices 375 defining an input impedance matching network on the back side 100b of the die 100, and a through substrate via to the gate 310 (outside of the illustrated cross-section); the output lead 1011o is coupled to the drain 305 by a wirebond 1025, the conductive traces 1021, and the corresponding frontside pillar 366; and the source 315 is grounded through the corresponding frontside pillar 366. While FIG. 10 illustrates the use of the backside passive devices 375 for input impedance matching only, it will be understood that one or more of the backside passive devices 375 may be similarly used for output impedance matching (with the wirebond 1025 connecting the output lead 1011o to one or more passive devices 375 at the back side 100b), or for both input and output impedance matching, as shown in the examples of FIGS. 11 and 12. Likewise, while illustrated as providing the ground connection to the source 315 through the frontside pillar 366, in other embodiments the ground connection to the source 315 may be implemented using the via 346, in some embodiments with one or more of the passive devices 375 defining a harmonic termination circuit on the back side 100b.

FIGS. 11 and 12 are cross-sectional views illustrating examples of thermally enhanced integrated circuit device packages including an RF transistor amplifier die 100 in accordance with some embodiments of the present disclosure. As shown in FIGS. 11 and 12, the open-cavity packages 1100, 1200 include devices 100 having components and connections similar to any of the embodiments described herein (shown by way of example with reference to the transistor structures 300-4), but mounted on a conductive base or flange 1120, 1220 and protected by a lid member 1113, 1213 of thermally enhanced packages. In particular, FIG. 11 illustrates a first implementation (referred to as a TEPAC package 1100) and FIG. 12 illustrates a second implementation (referred to as a T3PAC package 1200) of thermally enhanced packages in accordance with embodiments of the present disclosure. In some embodiments, the flange 1120, 1220 may provide both an attachment surface for the die 100 (and/or other components of the package) as well as thermal conductivity (e.g., a heat sink) for dissipating or otherwise transmitting heat generated by the components to the outside of the package 1100, 1200. The flange 1120, 1220 may also provide one of the terminals for the package 1100, 1200. For example, the flange 1120, 1220 may be configured to provide an electrical ground connection.

The TEPAC package 1100 of FIG. 11 may be a ceramic-based package that includes an upper housing defined by a lid member 1113 and a frame member (shown in cross-section as sidewalls 1110f. The lid member 1113 and/or sidewalls 1110f may include ceramic materials (e.g., alumina) and may define an open cavity surrounding the die 100 on the conductive base or flange 1120. The lid member 1113 may be glued to the sidewalls 1110f using an epoxy glue. The sidewalls 1110f may be attached to the base 1120 via brazing.

The T3PAC package 1200 of FIG. 12 may also be a ceramic-based package that includes a base 1220 and an upper housing with a lid member 1213 and a frame member (shown in cross-section as sidewalls 1210f. The lid member 1213 and sidewalls 1210f similarly define an open cavity surrounding the die 100 on the conductive base or flange 1220. In the package 1200, the lid member 1213 may be a ceramic material (e.g., alumina), while the sidewalls 1210f may be a printed circuit board (PCB).

In FIGS. 11 and 12, the flange 1120, 1220 may be an electrically conductive material, for example, a copper layer/laminate or an alloy or metal-matrix composite thereof. In some embodiments, the flange 1120 may include a copper-molybdenum (CuMo) layer, CPC (Cu/MoCu/Cu), or other copper alloys, such copper-tungsten CuW, and/or other laminate/multi-layer structures. In the example of FIG. 11, the flange 1120 may be a CPC-based structure to which the sidewalls 1110f and/or lid member 1113 are attached. In the example of FIG. 12, the flange 1220 may be a copper-molybdenum (RCM60)-based structure to which the sidewalls 1210f and/or lid member 1213 are attached, e.g., by a conductive glue.

In FIGS. 11 and 12, one of the terminals of the die 100 (e.g., a source contact 315) may be attached to the flange 1120, 1220, and the flange 1120, 1220 may thus provide the source lead for the package 1100, 1200. Conductive leads 1111, 1211 may provide gate and drain leads of the package 1100, and are attached to the flange 1120, 1220 and supported by the respective sidewalls 1110f, 1210f. In the examples of FIGS. 11 and 12, respective wire bonds 1125, 1225 are thus used to connect the package leads 1111, 1211 to the die 100 for connection to circuits or devices that are external to the package 1100, 1200.

In particular, in the examples of FIGS. 11 and 12, an input lead 1111i, 1211i is coupled to the gate 310 by a wirebond 1125, 1225, one or more of the passive devices 375 defining an input impedance matching network on the back side 100b of the die 100, and a through substrate via to the gate 310 (outside of the illustrated cross-section); the output lead 1111o, 1211o is coupled to the drain 305 by a wirebond 1125, 1225, one or more of the passive devices 375 defining an output impedance matching network on the back side 100b of the die 100, and a through substrate via to the drain 305 (outside of the illustrated cross-section); and the source 315 is grounded through the corresponding frontside pillar 366. It will be appreciated, however, that the backside passive devices 375 may be used only for input impedance matching, or only for output impedance matching. Likewise, in some embodiments, the backside passive devices 375 may be used to implement harmonic termination. Also, the wire bonds 1125, 1225 may be omitted in other embodiments and different electrical connections may be used. More generally, the packages 1000, 1100, 1200 described herein may include any combination of conductive vias, wirebonds, and/or conductive pillars to electrically connect the terminals 310, 305, 315 to input, output, and/or ground leads of the packages, with or without the use of the backside passive devices 375.

In the figures, the conductive pillars 366 are illustrated as free-standing, without encapsulation by other non-conductive materials. Such free-standing pillars 366 may provide benefits, including but not limited to reduced RF parasitic coupling, e.g., pillar-to-pillar, chip-to-chip/board and/or pillar-to-chip/board. However, it will be understood that any of the embodiments having conductive pillars 366 as described herein may further include an encapsulant material, such as an overmold, on or covering the pillars 366 between the insulating layers 350, 355, 360 and the attachment substrate, to provide additional protection (mechanical, humidity, etc.) and/or support for the pillars 366. In some embodiments, whether the pillars 366 are free-standing or supported by an encapsulant material may vary based on design elements (e.g., power, frequency, matching circuitry, packaging, etc.).

Embodiments of the present disclosure can be assembled on substrate or laminate (e.g., a redistribution layer (RDL) laminate), and assembled in batches using modern enhanced wafer level packaging techniques. By providing the passive devices 375 directly on the back side of the die 100, wire-bonding processes may be reduced or eliminated, thereby reducing fabrication time, cost, and package dimensions. The die 100 may include transistor cells of a power transistor device, e.g., defining an RF power amplifier. In some embodiments, the die 100 may include discrete multi-stage, and monolithic microwave integrated circuit (MMIC), and/or multi-path (e.g., Doherty) transistor devices.

Embodiments of the present disclosure may be used in various cellular infrastructure (CIFR) RF power products (including, but not limited to 5 W, 10 W, 20 W, 40 W, 60 W, 80 W and different frequency bands) e.g., for 5G and base station applications. Embodiments of the present disclosure may also be applied to radar and MMIC-type applications. More generally, embodiments of the present disclosure may be applied in GaN HEMI discrete and RF IC technologies, as well as in power MOSFET. Schottky, or any devices that may use wire bonds for external connections and/or may benefit from integration of passive device elements.

Various embodiments have been described herein with reference to the accompanying drawings in which example embodiments are shown. These embodiments may, however, be embodied in different forms and should not be construed as limited to the embodiments set forth herein. Rather, these embodiments are provided so that this disclosure is thorough and complete and fully conveys the inventive concept to those skilled in the art. Various modifications to the example embodiments and the generic principles and features described herein will be readily apparent. In the drawings, the sizes and relative sizes of layers and regions are not shown to scale, and in some instances may be exaggerated for clarity.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on," "attached," or extending "onto" another element, it can be directly on the other element or intervening elements may also be present. In contrast, when an element is referred to as being "directly on" or "directly attached" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Elements illustrated by dotted lines may be optional in the embodiments illustrated.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

In the drawings and specification, there have been disclosed typical embodiments of the invention and, although specific terms are employed, they are used in a generic and descriptive sense only and not for purposes of limitation, the scope of the invention being set forth in the following claims.

The invention claimed is:

1. A transistor device, comprising:
   a die comprising a first surface, a second surface, a semiconductor layer structure that is between the first and second surfaces and comprises a plurality of transistor cells, and terminals coupled to the transistor cells;
   one or more conductive pillar structures that protrude from the first surface of the die and are electrically connected to one or more of the terminals; and
   at least one conductive via that extends into the second surface of the die.

2. The transistor device of claim 1, wherein the terminals comprise an input terminal, an output terminal, and/or a ground terminal.

3. The transistor device of claim 2, wherein the one or more conductive pillar structures provide electrical connection to the input terminal and/or the output terminal, and wherein the at least one conductive via provides electrical connection to the ground terminal.

4. The transistor device of claim 1, wherein the die comprises a substrate between the semiconductor layer structure and the second surface of the die, the at least one conductive via extends through the substrate, and the semiconductor layer structure comprises one or more epitaxial layers on the substrate.

5. The transistor device of claim 1, wherein the semiconductor layer structure comprises a Group-III nitride material.

6. The transistor device of claim 5, wherein the die comprises a silicon carbide substrate between the Group-III nitride material and the second surface.

7. The transistor device of claim 1, further comprising:
   a package substrate comprising one or more conductive connections,
   wherein the one or more conductive pillar structures attach the die to the package substrate adjacent the first surface of the die, and electrically connect the one or more of the terminals to the one or more conductive connections.

8. The transistor device of claim 1, further comprising:
   a package substrate comprising at least one conductive connection,
   wherein the die is attached to the package substrate adjacent the second surface of the die, and the at least one conductive via electrically connects at least one of the terminals to the at least one conductive connection.

9. The transistor device of claim 2, further comprising:
at least one passive electronic component on the second surface of the die, wherein the at least one passive electronic component is electrically connected to at least one of the terminals by the at least one conductive via.

10. A transistor device, comprising:
a die comprising a first surface, a second surface, a semiconductor layer structure that is between the first and second surfaces and comprises a plurality of transistor cells adjacent the first surface, and terminals coupled to the transistor cells;
at least one passive electronic component on the second surface of the die and electrically connected to at least one of the terminals; and
one or more conductive pillar structures that protrude from the first surface of the die and provide electrical connections to one or more of the terminals.

11. The transistor device of claim 10, wherein the terminals comprise an input terminal, an output terminal, and/or a ground terminal.

12. The transistor device of claim 11, wherein the at least one passive electronic component is at least one integrated passive device (IPD) comprising a discrete capacitor, inductor, and/or resistor on the second surface of the die.

13. The transistor device of claim 11, further comprising:
a metal layer extending on the second surface of the die and electrically connecting the at least one passive electronic component to the at least one of the terminals.

14. The transistor device of claim 13, wherein the metal layer is a first metal layer, and further comprising:
an insulator layer on the first metal layer opposite the second surface,
wherein the at least one passive electronic component is on the insulator layer opposite the first metal layer, and comprises patterns of a second metal layer defining one or more discrete capacitors, inductors, and/or resistors.

15. The transistor device of claim 13, further comprising:
at least one conductive via that extends into the second surface of the die and the semiconductor layer structure to electrically connect the metal layer on the second surface of the die to the at least one of the terminals.

16. The transistor device of claim 10, wherein the semiconductor layer structure comprises a Group-III nitride material.

17. The transistor device of claim 16, wherein the die comprises a silicon carbide substrate between the Group-III nitride material and the second surface.

18. The transistor device of claim 10, further comprising:
a package substrate comprising one or more conductive connections,
wherein the one or more conductive pillar structures attach the die to the package substrate adjacent the first surface of the die, and electrically connect the one or more of the terminals to the one or more conductive connections.

19. A method of fabricating a transistor device, the method comprising:
forming a transistor structure comprising a first surface, a second surface, a semiconductor layer structure that is between the first and second surfaces and comprises a plurality of transistor cells, and terminals coupled to the transistor cells;
forming one or more conductive pillar structures that protrude from the first surface to provide electrical connections to one or more of the terminals; and
forming at least one conductive via that extends into the second surface.

20. The method of claim 19, wherein the transistor structure further comprises a substrate between the semiconductor layer structure and the second surface, wherein forming the at least one conductive via comprises:
attaching the first surface to a wafer carrier;
performing a thinning operation on the second surface to reduce a thickness of the substrate; and
forming the at least one conductive via extending into the second surface to provide electrical connection to at least one of the terminals responsive to the thinning operation and with the first surface attached to the wafer carrier.

21. The method of claim 20, wherein forming the one or more conductive pillar structures is performed before attaching the first surface to the wafer carrier.

22. The method of claim 20, wherein the wafer carrier is a first wafer carrier, and wherein forming the one or more conductive pillar structures comprises:
detaching the first surface from the first wafer carrier;
attaching the second surface to a second wafer carrier; and
forming the one or more conductive pillar structures on the first surface with the second surface attached to the second wafer carrier.

23. The method of claim 20, further comprising:
forming at least one passive electronic component on the second surface with the first surface attached to the wafer carrier,
wherein the at least one passive electronic component is electrically connected to the at least one of the terminals by the at least one conductive via.

24. The method of claim 23, wherein forming the at least one passive electronic component comprises:
forming a first metal layer on the second surface responsive to the thinning operation;
forming an insulator layer on the first metal layer opposite the second surface; and
forming and patterning a second metal layer on the insulator layer opposite the first metal layer, wherein the at least one passive electronic component comprises patterns of the second metal layer defining one or more discrete capacitors, inductors, and/or resistors.

25. A method of fabricating a transistor device, the method comprising:
forming a transistor structure comprising a first surface, a second surface, a semiconductor layer structure that is between the first and second surfaces and comprises a plurality of transistor cells, a substrate between the semiconductor layer structure and the second surface, and terminals coupled to the transistor cells;
forming one or more conductive pillar structures that protrude from the first surface to provide electrical connections to one or more of the terminals; and
singulating the transistor structure to define a die comprising a portion of the substrate having a thickness of about 50 to about 800 microns.

26. The method of claim 25, wherein a sidewall of the die extending between the first and second surfaces comprises a first portion adjacent the first surface having a surface characteristic that differs from a second portion adjacent the second surface.

27. The method of claim 26, further comprising:
forming a trench in the semiconductor layer structure extending from the first surface toward the second surface through the semiconductor layer structure and into the substrate to define the first portion of the sidewall of the die.

28. The method of claim 27, wherein forming the trench is performed before forming the one or more conductive pillar structures.

29. The method of claim 27, wherein singulating comprises dicing or sawing through a bottom of the trench in the substrate to define the second portion of the sidewall of the die.

30. The method of claim 25, wherein the semiconductor layer structure comprises a Group-III nitride, and wherein the substrate comprises silicon carbide.

* * * * *

UNITED STATES PATENT AND TRADEMARK OFFICE
CERTIFICATE OF CORRECTION

PATENT NO. : 11,842,997 B2
APPLICATION NO. : 17/699680
DATED : December 12, 2023
INVENTOR(S) : Alcorn et al.

It is certified that error appears in the above-identified patent and that said Letters Patent is hereby corrected as shown below:

In the Specification

Column 21, Line 28: Please correct "11100" to read --1110f)--

Column 21, Line 38: Please correct "12100" to read --1210f)--

Column 22, Line 7: Please correct "12110" to read --1211o--

Column 22, Line 60: Please correct "HEMI" to read --HEMT--

Signed and Sealed this
Fifth Day of March, 2024

Katherine Kelly Vidal
*Director of the United States Patent and Trademark Office*